(12) United States Patent
Baek et al.

(10) Patent No.: US 12,490,481 B2
(45) Date of Patent: Dec. 2, 2025

(54) SEMICONDUCTOR DEVICES AND METHODS FOR FABRICATING THE SAME

(71) Applicant: Samsung Electronics Co., Ltd., Suwon-si (KR)

(72) Inventors: Bong Kwan Baek, Suwon-si (KR); Jun Hyuk Lim, Suwon-si (KR); Jung Hwan Chun, Suwon-si (KR); Kyu-Hee Han, Suwon-si (KR); Jong Min Baek, Suwon-si (KR); Koung Min Ryu, Suwon-si (KR); Jung Hoo Shin, Suwon-si (KR); Sang Shin Jang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 487 days.

(21) Appl. No.: 18/056,736

(22) Filed: Nov. 18, 2022

(65) Prior Publication Data

US 2023/0326964 A1 Oct. 12, 2023

(30) Foreign Application Priority Data

Apr. 12, 2022 (KR) ........................ 10-2022-0045199

(51) Int. Cl.
*H01L 29/06* (2006.01)
*H01L 29/417* (2006.01)
(Continued)

(52) U.S. Cl.
CPC ........... *H10D 62/121* (2025.01); *H10D 30/47* (2025.01); *H10D 30/6729* (2025.01); *H10D 30/6757* (2025.01)

(58) Field of Classification Search
CPC .. H10D 62/121; H10D 30/47; H10D 30/6729; H10D 30/6757; H10D 30/6735;
(Continued)

(56) References Cited

U.S. PATENT DOCUMENTS 10,283,406 B2  5/2019  Basker et al.
10,672,773 B2  6/2020  Ji et al.
(Continued)

OTHER PUBLICATIONS

European Office Action corresponding to EP Application No. 23155297.7; dated Sep. 20, 2023 (8 pages).
(Continued)

*Primary Examiner* — Tong-Ho Kim
(74) *Attorney, Agent, or Firm* — Wolf, Greenfield & Sacks, P.C.

(57) ABSTRACT

Semiconductor devices with improved performance and reliability and methods for forming the same are provided. The semiconductor devices include an active pattern extending in a first direction, gate structures spaced apart from each other in the first direction on the active pattern, a source/drain pattern on the active pattern, a source/drain contact on the source/drain pattern, and a contact liner extending along a sidewall of the source/drain contacts. A carbon concentration of the contact liner at a first point of the contact liner is different from a carbon concentration of the contact liner at a second point of the contact liner, and the first point is at a first height from an upper surface of the active pattern, the second point is at a second height from the upper surface of the active pattern, and the first height is smaller than the second height.

19 Claims, 33 Drawing Sheets

(51) Int. Cl.
  *H01L 29/778* (2006.01)
  *H01L 29/786* (2006.01)
  *H10D 30/47* (2025.01)
  *H10D 30/67* (2025.01)
  *H10D 62/10* (2025.01)

(58) Field of Classification Search
  CPC ...... H10D 62/83; H10D 64/017; H10D 64/62; H10D 30/6219; H10D 64/256; H10D 64/01; H10D 84/013; H10D 84/0149; H10D 84/038; H10D 30/014; H10D 30/43; H10D 30/62; H10D 84/83; H10D 62/10; H10D 64/511; H10D 30/611; H10D 84/834; H10D 30/024; H10D 84/853; H01L 23/5283; H01L 21/76832; H01L 23/485; H01L 21/76805; H01L 21/76831; H01L 21/76843; B82Y 10/00
  USPC .......................................................... 257/288
  See application file for complete search history.

(56) References Cited

U.S. PATENT DOCUMENTS

| | | | |
|---|---|---|---|
| 10,950,434 | B2 | 3/2021 | Jhan et al. |
| 10,971,589 | B2 | 4/2021 | Kao et al. |
| 11,121,234 | B2 | 9/2021 | Liaw |
| 2013/0049219 | A1 | 2/2013 | Tsai et al. |
| 2016/0141381 | A1 | 5/2016 | Kim et al. |
| 2017/0222014 | A1* | 8/2017 | Tak .................. H01L 21/76843 |
| 2020/0027719 | A1 | 1/2020 | Liao et al. |
| 2021/0066453 | A1* | 3/2021 | Lee .................... H10D 30/6219 |
| 2021/0184018 | A1* | 6/2021 | Khaderbad ....... H01L 21/76804 |
| 2021/0407808 | A1* | 12/2021 | Chou ................ H01L 21/31111 |
| 2021/0408262 | A1 | 12/2021 | Liaw |

OTHER PUBLICATIONS

European Search Report corresponding to EP Application No. 23155297.7; dated Sep. 8, 2023 (4 pages).

* cited by examiner

SEMICONDUCTOR DEVICES AND METHODS FOR FABRICATING THE SAME

CROSS-REFERENCE TO RELATED APPLICATION

This application claims priority from Korean Patent Application No. 10-2022-0045199 filed on Apr. 12, 2022 in the Korean Intellectual Property Office, and all the benefits accruing therefrom under 35 U.S.C. 119, the disclosure of which in its entirety is herein incorporated by reference.

BACKGROUND

The present disclosure relates to a semiconductor device and a method for fabricating the same.

As one of the scaling down techniques for increasing a density of semiconductor devices, a multi-gate transistor in which a multi-channel active pattern (or silicon body) having a fin or nanowire shape is formed on a substrate and a gate is formed on a surface of the multi-channel active pattern has been proposed.

Such a multi-gate transistor uses a three-dimensional channel, and is thus easily scaled down. In addition, the multi-gate transistor may improve current control capability without increasing a gate length of the multi-gate transistor. In addition, the multi-gate transistor may effectively suppress a short channel effect (SCE) in which a potential of a channel region is affected by a drain voltage.

Meanwhile, as a pitch size of the semiconductor device decreases, research for reducing capacitance and securing electrical stability between contacts in the semiconductor device has been conducted.

SUMMARY

Aspects of the present disclosure provide semiconductor devices capable of improving performance and reliability of the devices and/or elements therein.

Aspects of the present disclosure provide methods for fabricating a semiconductor device capable of improving performance and reliability of the device and/or elements therein.

However, aspects of the present disclosure are not restricted to those set forth herein. The above and other aspects of the present disclosure will become more apparent to one of ordinary skill in the art to which the present disclosure pertains by referencing the detailed description of the present disclosure provided herein.

According to some embodiments of the present invention, there is provided a semiconductor device comprising an active pattern extending in a first direction, a plurality of gate structures disposed to be spaced apart from each other in the first direction on the active pattern and including a gate structure that includes a gate electrode and a gate spacer, the gate electrode extending in a second direction, a source/drain pattern on the active pattern, a source/drain contact on the source/drain pattern, and a contact liner extending along a sidewall of the source/drain contacts, wherein a concentration of carbon contained in the contact liner at a first point of the contact liner is different from a concentration of carbon contained in the contact liner at a second point of the contact liner, and the first point is at a first height from an upper surface of the active pattern, the second point is at a second height from the upper surface of the active pattern, and the first height is smaller than the second height.

According to some embodiments of the present invention, there is provided a semiconductor device comprising an active pattern extending in a first direction, a field insulating layer extending on (e.g., covering) a sidewall of the active pattern, a plurality of gate structures disposed to be spaced apart from each other in the first direction on the active pattern, each of the plurality of gate structures including a gate electrode, and the gate electrode extending in a second direction, a source/drain pattern on the active pattern, an etching stop layer extending along an upper surface of the field insulating layer and a profile (e.g., a surface) of the source/drain pattern, an interlayer insulating layer on the etching stop layer, a source/drain contact disposed in the interlayer insulating layer and connected to the source/drain pattern, and a contact liner disposed between the source/drain contact and the interlayer insulating layer, wherein a ratio of carbon to oxygen at a first point of the contact liner is smaller than a ratio of carbon to oxygen at a second point of the contact liner, and the first point is at a first height from a bottom surface of the source/drain pattern, the second point is at a second height from the bottom surface of the source/drain pattern, and the first height is smaller than the second height.

According to some embodiments of the present invention, there is provided a semiconductor device comprising an active pattern including a lower pattern extending in a first direction and a sheet pattern spaced apart from the lower pattern in a second direction, a plurality of gate structures disposed to be spaced apart from each other in the first direction on the lower pattern, each of the plurality of gate structures including a gate electrode and a gate spacer, and the gate electrode extending in a third direction, a source/drain pattern disposed on the lower pattern and in contact with the sheet pattern, a source/drain contact on the source/drain pattern, a contact silicide layer between the source/drain pattern and the source/drain contact, and a contact liner extending along a sidewall of the source/drain contact and including SiOC, wherein a concentration of carbon contained in the contact liner at a first point of the contact liner is lower than a concentration of carbon contained in the contact liner at a second point of the contact liner, and the first point is at a first height from an upper surface of the active pattern, the second point is at a second height from the upper surface of the active pattern, and the first height is smaller than the second height.

According to some embodiments of the present invention, there is provided a method for fabricating a semiconductor device comprising forming a source/drain pattern, an etching stop layer, and an interlayer insulating layer on an active pattern, forming a contact hole in the interlayer insulating layer, forming a contact liner along a sidewall of the contact hole, and filling the contact hole on the contact liner, thereby forming a source/drain contact in the contact hole on the contact liner, the source/drain contact being connected to the source/drain pattern, wherein a concentration of carbon contained in the contact liner increases with increasing distance from an upper surface of the active pattern.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION

Figure 1:
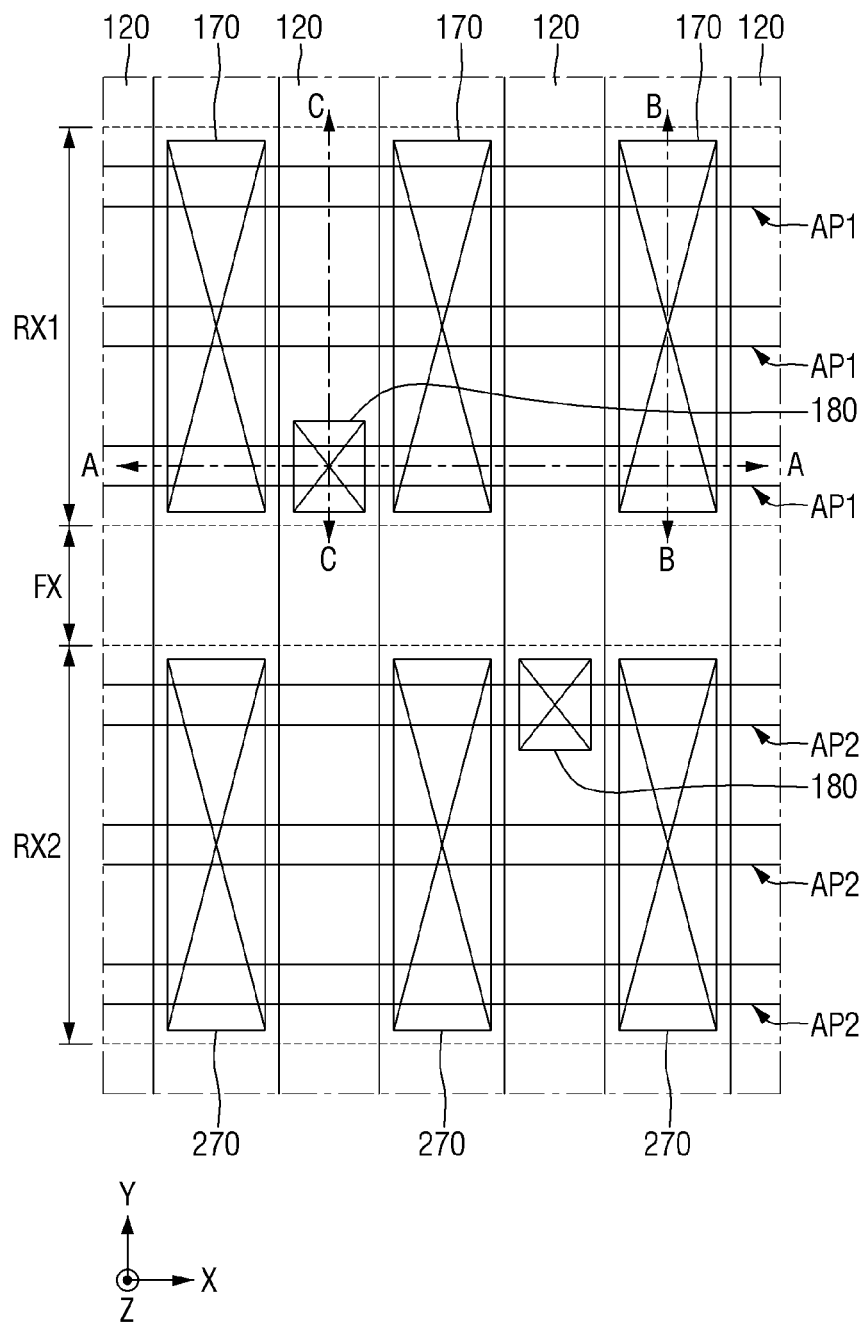
FIG. 1 is an example layout of a semiconductor device according to some embodiments.

In the drawings of a semiconductor device according to some embodiments, a fin-type transistor (FinFET) including a channel region having a fin-type pattern shape, a transistor including nanowires or nanosheets, a multi-bridge channel field effect transistor (MBCFET™), or vertical FET is illustrated, but the present disclosure is not limited thereto. The semiconductor device according to some embodiments may include a tunneling FET or a three-dimensional (3D) transistor. The semiconductor device according to some embodiments may include a planar transistor. In addition, a technical idea of the present disclosure may be applied to two-dimensional (2D) material based FETs and a heterostructure thereof.

In addition, the semiconductor device according to some embodiments may also include a bipolar junction transistor, a lateral double-diffused metal oxide semiconductor (LDMOS) transistor, or the like.

The semiconductor device according to some embodiments will be described with reference to FIGS. 1 to 6.

Figure 2:
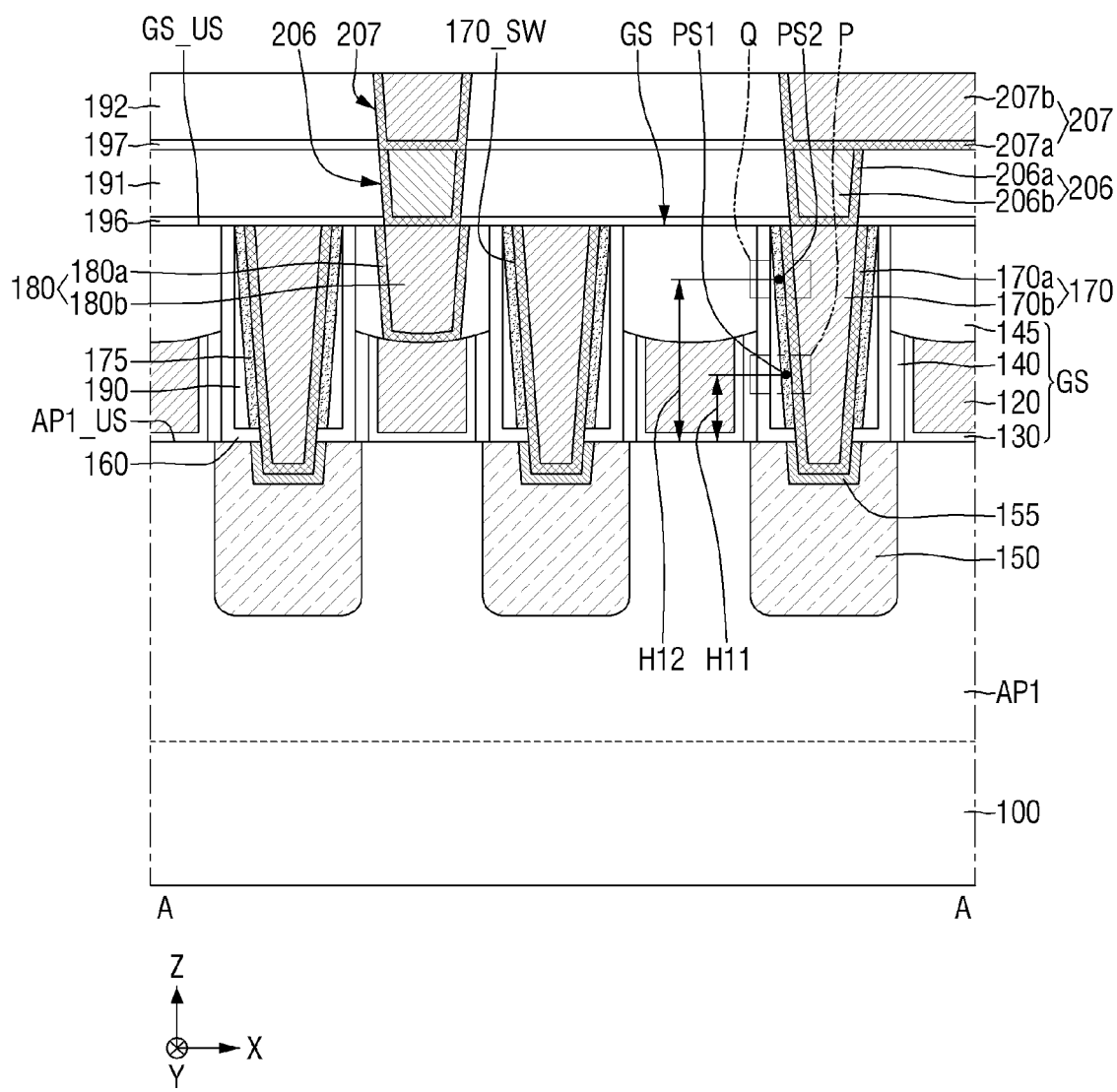
FIGS. 2 to 4 are cross-sectional views taken along lines A-A, B-B, and C-C of FIG. 1.
Figure 3:
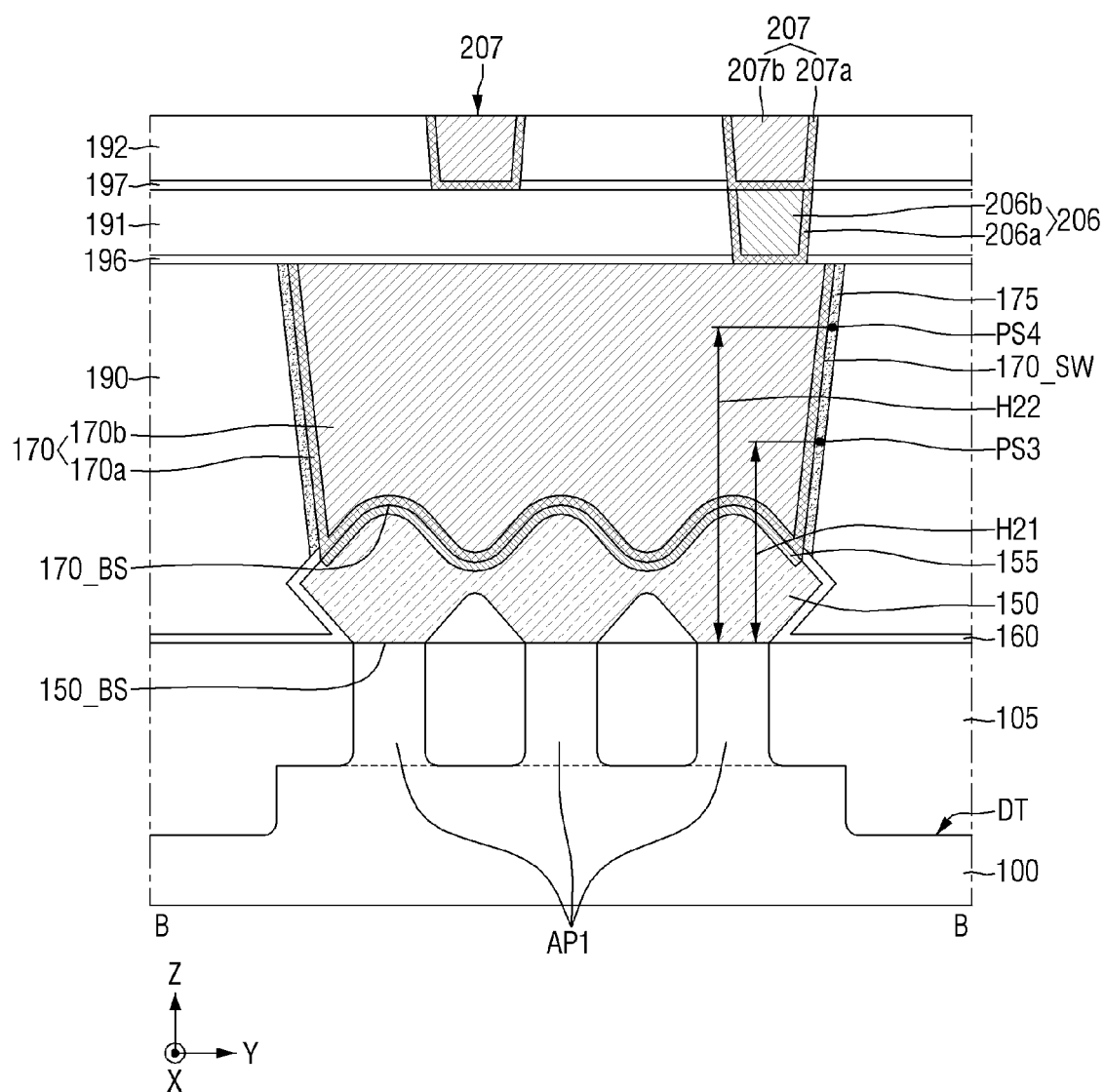
Figure 4:
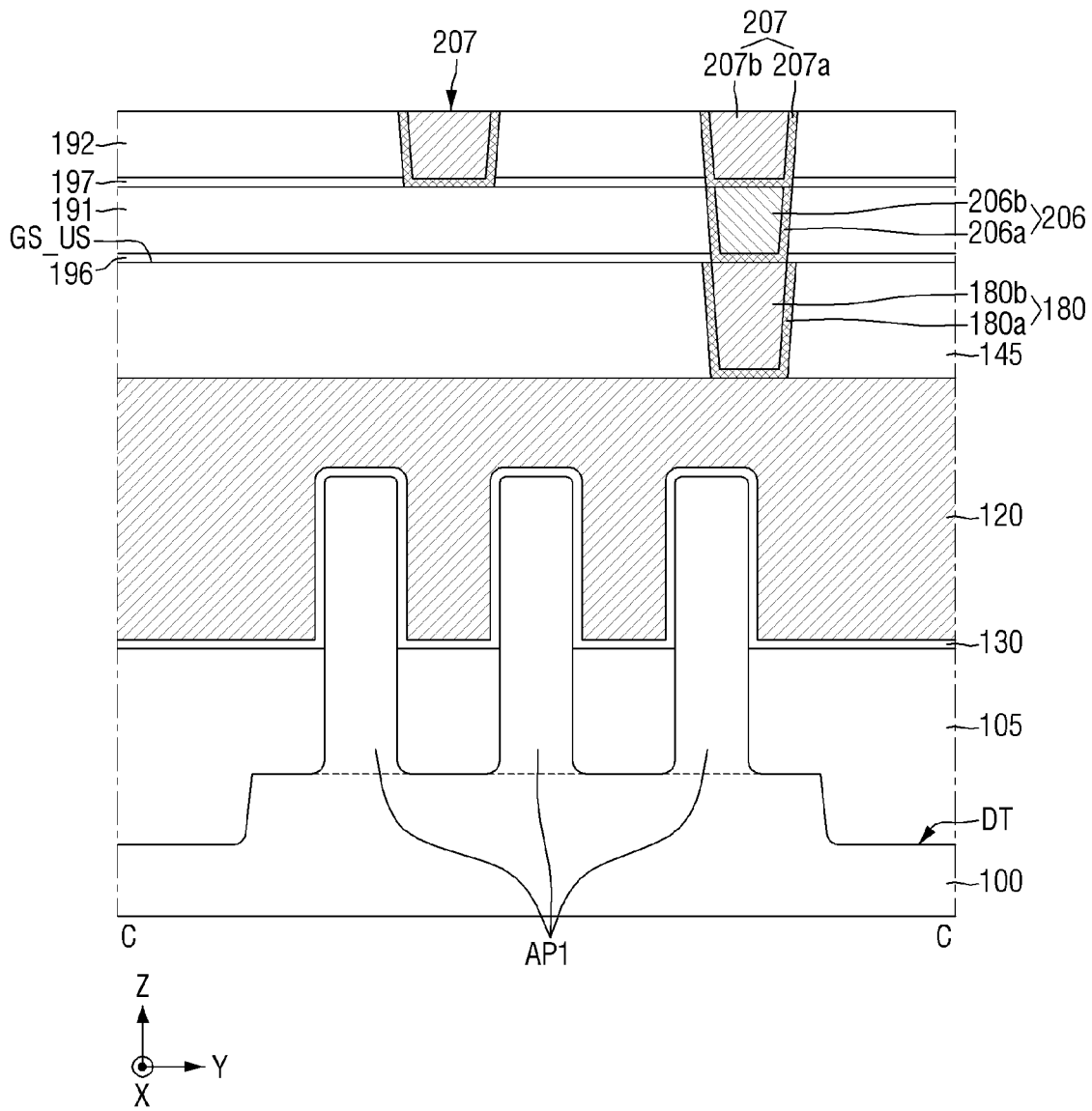
Figure 5:
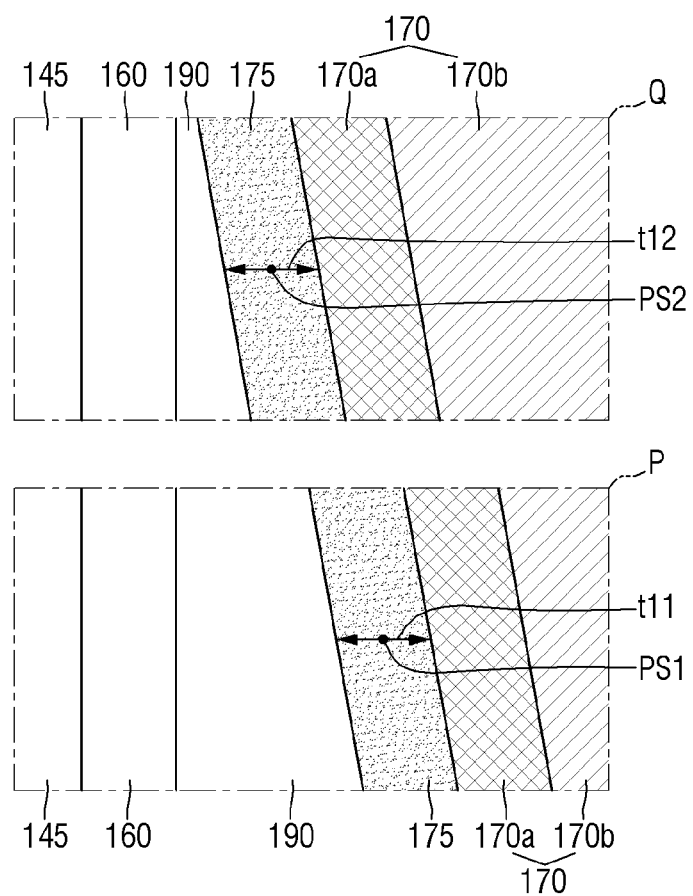
FIG. 5 is an enlarged view of part P and part Q of FIG. 2.
Figure 6:
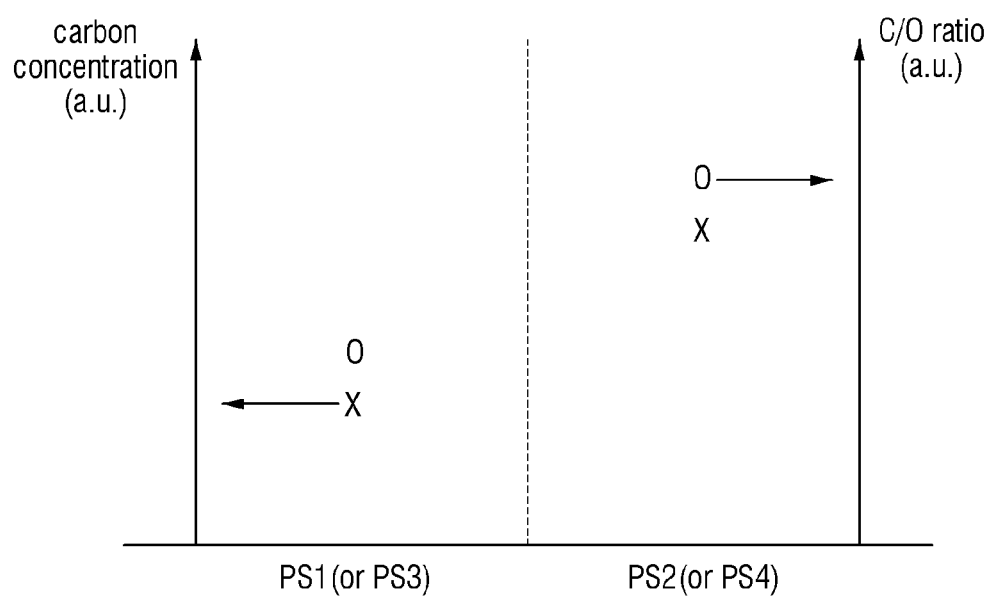
FIG. 6 is a graph illustrating a carbon concentration and a ratio of carbon to oxygen at a first point PS1 and a second point PS2 of FIG. 2.

FIG. 1 is an example layout of a semiconductor device according to some embodiments. FIGS. 2 to 4 are cross-sectional views taken along lines A-A, B-B, and C-C of FIG. 1. FIG. 5 is an enlarged view of part P and part Q of FIG. 2. FIG. 6 is a graph illustrating a carbon concentration and a ratio of carbon to oxygen at a first point PS1 and a second point PS2 of FIG. 2. For convenience of explanation, a via plug 206 and a wiring line 207 are not illustrated in FIG. 1.

For reference, it is illustrated in FIG. 2 that a via plug 206 connected to a first source/drain contact 170 and a via plug 206 connected to a gate contact 180 are disposed to be adjacent to each other in a first direction X on one first active pattern AP1. However, the arrangement of the via plugs 206 is only for convenience of explanation, and is not limited thereto.

Although not illustrated, a cross-sectional view taken along a second active pattern AP2 in the first direction X may be similar to FIG. 2, except for positions of the via plug 206 and the wiring line 207.

Referring to FIGS. 1 to 6, the semiconductor device according to some embodiments may include at least one or more first active patterns AP1, at least one or more second active patterns AP2, at least one or more first gate electrodes 120, first source/drain contacts 170, second source/drain contacts 270, and gate contacts 180.

A substrate 100 may include a first active region RX1, a second active region RX2, and a field region FX. The field region FX may be formed to be immediately adjacent to the first active region RX1 and the second active region RX2. The field region FX may form a boundary with the first active region RX1 and the second active region RX2.

The first active region RX1 and the second active region RX2 are spaced apart from each other. The first active region RX1 and the second active region RX2 may be isolated by the field region FX.

In other words, an element isolation layer may be disposed around the first active region RX1 and the second active region RX2 that are spaced apart from each other. In this case, a portion of the element isolation layer between the first active region RX1 and the second active region RX2 may be the field region FX. For example, a portion in which a channel region of a transistor, which may be an example of the semiconductor device, is formed may be an active region, and a portion that isolates the channel region of the transistor formed in the active region may be a field region. Alternatively, the active region may be a portion in which a fin-shaped pattern or a nanosheet used as the channel region of the transistor is formed, and the field region may be a region in which the fin-shaped pattern used as the channel region or the nanosheet is not formed.

As illustrated in FIGS. 3 and 4, the field region FX may be defined by a deep trench DT, but is not limited thereto. In addition, it is apparent that a person skilled in the art to which the present disclosure pertains may distinguish which part is the field region and which part is the active region.

For example, one of the first active region RX1 and the second active region RX2 may be a PMOS region and the other may be an NMOS region. As another example, the first active region RX1 and the second active region RX2 may be a PMOS formation region. As still another example, the first active region RX1 and the second active region RX2 may be an NMOS formation region.

The substrate 100 may be a silicon substrate or a silicon-on-insulator (SOI). Unlike this, the substrate 100 may include silicon-germanium, silicon germanium on insulator (SGOI), indium antimonide, a lead tellurium compound, indium arsenide, indium phosphide, gallium arsenide, or gallium antimonide, but is not limited thereto.

At least one or more first active pattern AP1 may be formed in the first active region RX1. The first active pattern AP1 may protrude from the substrate 100 of the first active region RX1. The first active pattern AP1 may extend to be long along the first direction X on the substrate 100. For example, the first active pattern AP1 may include a long side extending in the first direction X and a short side extending in a second direction Y. Here, the first direction X may intersect the second direction Y and a third direction Z. In addition, the second direction Y may intersect the third direction Z. The third direction Z may be a thickness direction of the substrate 100.

At least one or more second active pattern AP2 may be formed in the second active region RX2. A description of the second active pattern AP2 may be substantially the same as a description of the first active pattern AP1.

Each of the first active pattern AP1 and the second active pattern AP2 may be a multi-channel active pattern. In the semiconductor device according to some embodiments, each of the first active pattern AP1 and the second active pattern AP2 may be, for example, a fin-shaped pattern. Each of the first active pattern AP1 and the second active pattern AP2 may be used as the channel region of the transistor. The first active pattern AP1 and the second active pattern AP2, each of which are three, are illustrated, but this is only for convenience of explanation and the present disclosure is not limited thereto. Each of the first active pattern AP1 and the second active pattern AP2 may be one or more.

Each of the first active pattern AP1 and the second active pattern AP2 may also be a portion of the substrate 100 and may include an epitaxial layer grown from the substrate 100. The first active pattern AP1 and the second active pattern AP2 may include, for example, silicon or germanium, which is an elemental semiconductor material. In addition, the first active pattern AP1 and the second active pattern AP2 may include a compound semiconductor, for example, a group IV-IV compound semiconductor or a group III-V compound semiconductor.

The group W-W compound semiconductor may be, for example, a binary compound or a ternary compound including at least two or more of carbon (C), silicon (Si), germanium (Ge), and tin (Sn), or a compound obtained by doping carbon (C), silicon (Si), germanium (Ge), and tin (Sn) with a group IV element.

The III-V compound semiconductor may be, for example, one of a binary compound, a ternary compound, or a quaternary compound formed by combining at least one of aluminum (Al), gallium (Ga), and indium (In) as a group III element and one of phosphorus (P), arsenic (As), and antimony (Sb), which are group V elements.

As an example, the first active pattern AP1 and the second active pattern AP2 may include the same material. For example, each of the first active pattern AP1 and the second active pattern AP2 may be a silicon fin-type pattern. Alternatively, for example, each of the first active pattern AP1 and the second active pattern AP2 may be a fin-shaped pattern including a silicon-germanium pattern. As another example, the first active pattern AP1 and the second active pattern AP2 may include different materials. For example, the first active pattern AP1 may be a silicon fin-shaped pattern, and the second active pattern AP2 may be a fin-shaped pattern including a silicon-germanium pattern.

A field insulating layer 105 may be formed on the substrate 100. The field insulating layer 105 may be formed across the first active region RX1, the second active region RX2, and the field region FX. The field insulating layer 105 may fill the deep trench DT.

The field insulating layer 105 may cover a sidewall of the first active pattern AP1 and a sidewall of the second active pattern AP2. The first active pattern AP1 and the second active pattern AP2 may protrude upward from an upper surface of the field insulating layer 105. The field insulating layer 105 may include, for example, an oxide layer, a nitride layer, an oxynitride layer, or a combination thereof.

At least one or more gate structures GS may be disposed on the substrate 100. For example, at least one or more gate structures GS may be disposed on the field insulating layer 105. The gate structure GS may extend in the second direction Y. The gate structures GS adjacent to each other may be spaced apart from each other in the first direction X.

The gate structure GS may be disposed on the first active pattern AP1 and the second active pattern AP2. The gate structure GS may intersect the first active pattern AP1 and the second active pattern AP2.

Although the gate structure GS is illustrated as being disposed across the first active region RX1 and the second active region RX2, it is only for convenience of explanation and the present disclosure is not limited thereto. That is, a portion of the gate structure GS may be isolated into two portions by a gate isolation structure disposed on the field insulating layer 105 and disposed on the first active region RX1 and the second active region RX2.

The gate structure GS may include, for example, a gate electrode 120, a gate insulating layer 130, a gate spacer 140, and a gate capping pattern 145.

The gate electrode 120 may be disposed on the first active pattern AP1 and the second active pattern AP2. The gate electrode 120 may intersect the first active pattern AP1 and the second active pattern AP2. The gate electrode 120 may surround the first active pattern AP1 and the second active pattern AP2 protruding from the upper surface of the field insulating layer 105. The gate electrode 120 may include a long side extending in the second direction Y and a short side extending in the first direction X.

An upper surface of the gate electrode 120 may be a concave surface recessed toward an upper surface of the first active pattern AP1, but is not limited thereto. That is, unlike illustrated, the upper surface of the gate electrode 120 may be flat in some embodiments.

The gate electrode 120 may include, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and combinations thereof.

The gate electrode 120 may include conductive metal oxide, conductive metal oxynitride, and the like, respectively, and may include an oxidized form of the above-described material.

The gate electrodes 120 may be disposed on both sides of the source/drain pattern 150, which will be described later. The gate structures GS may be disposed on both sides of the source/drain pattern 150 in the first direction X.

As an example, all of the gate electrodes 120 disposed on both sides of the source/drain pattern 150 may be normal gate electrodes used as gates of the transistor. As another example, the gate electrode 120 disposed on one side of the source/drain pattern 150 is used as the gate of the transistor, but the gate electrode 120 disposed on the other side of the source/drain pattern 150 may be a dummy gate electrode.

The gate spacer 140 may be disposed on a sidewall of the gate electrode 120. The gate spacer 140 may extend in the second direction Y. The gate spacer 140 may include, for example, silicon nitride (SiN), silicon oxynitride (SiON), silicon oxide ($SiO_2$), silicon oxycarbonitride (SiOCN), silicon boronitride (SiBN), silicon oxyboronitride (SiOBN), silicon oxycarbide (SiOC), and combinations thereof.

The gate insulating layer 130 may extend along a sidewall and a bottom surface of the gate electrode 120. The gate insulating layer 130 may be formed on the first active pattern AP1, the second active pattern AP2, and the field insulating layer 105. The gate insulating layer 130 may be formed between the gate electrode 120 and the gate spacer 140.

The gate insulating layer 130 may be formed along a profile of the first active pattern AP1 protruding upward from the field insulating layer 105 and along the upper surface of the field insulating layer 105. Although not illustrated, the first gate insulating layer 130 may be formed along a profile of the second active pattern AP2 protruding upward from the field insulating layer 105. As used herein, "a profile of an element A" may refer to a surface of the element A.

The gate insulating layer 130 may include silicon oxide, silicon oxynitride, silicon nitride, or a high-k material having a dielectric constant greater than that of the silicon oxide. The high-k material may include, for example, one or more of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

Although the gate insulating layer 130 is illustrated as a single layer, it is only for convenience of explanation and the present disclosure is not limited thereto. The gate insulating layer 130 may include a plurality of layers. The gate insulating layer 130 may also include an interfacial layer and a high-k insulating layer disposed between the first active pattern AP1 and the gate electrode 120 and between the second active pattern AP2 and the gate electrode 120. For example, the interfacial layer may be formed along the profile of the first active pattern AP1 and the profile of the second active pattern AP2 protruding upward from the field insulating layer 105.

The semiconductor device according to some embodiments may include a negative capacitance (NC) FET using a negative capacitor. For example, the gate insulating layer 130 may include a ferroelectric material layer having ferroelectric characteristics and a paraelectric material layer having paraelectric characteristics.

The ferroelectric material layer may have a negative capacitance, and the paraelectric material layer may have a positive capacitance. For example, when two or more capacitors are connected to each other in series and the capacitance of each capacitor has a positive value, a total capacitance decreases as compared with a capacitance of each individual capacitor. On the other hand, when at least one of the capacitances of two or more capacitors connected to each other in series has a negative value, the total capacitance may be greater than an absolute value of each individual capacitance while having a positive value.

When the ferroelectric material layer having the negative capacitance and the paraelectric material layer having the positive capacitance are connected to each other in series, a total capacitance value of the ferroelectric material layer and the paraelectric material layer connected to each other in series may increase. A transistor including the ferroelectric material layer may have a subthreshold swing (SS) less than 60 mV/decade at room temperature by using the increase in the total capacitance value.

The ferroelectric material layer may have the ferroelectric characteristics. The ferroelectric material layer may include, for example, at least one of hafnium oxide, hafnium zirconium oxide, barium strontium titanium oxide, barium titanium oxide, and lead zirconium titanium oxide. Here, as an example, the hafnium zirconium oxide may be a material obtained by doping hafnium oxide with zirconium (Zr). As another example, the hafnium zirconium oxide may be a compound of hafnium (Hf), zirconium (Zr), and oxygen (O).

The ferroelectric material layer may further include a doped dopant. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). A type of dopant included in the ferroelectric material layer may vary depending on a type of ferroelectric material included in the ferroelectric material layer.

When the ferroelectric material layer includes the hafnium oxide, the dopant included in the ferroelectric material layer may include, for example, at least one of gadolinium (Gd), silicon (Si), zirconium (Zr), aluminum (Al), and yttrium (Y).

When the dopant is aluminum (Al), the ferroelectric material layer may include 3 to 8 atomic % (at %) of aluminum. Here, a ratio of the dopant may be a ratio of aluminum to the sum of hafnium and aluminum.

When the dopant is silicon (Si), the ferroelectric material layer may include 2 to 10 at % of silicon. When the dopant is yttrium (Y), the ferroelectric material layer may include 2 to 10 at % of yttrium. When the dopant is gadolinium (Gd), the ferroelectric material layer may contain 1 to 7 at % of gadolinium. When the dopant is zirconium (Zr), the ferroelectric material layer may include 50 to 80 at % of zirconium.

The paraelectric material layer may have the paraelectric characteristics. The paraelectric material layer may include, for example, at least one of silicon oxide and metal oxide having a high dielectric constant. The metal oxide included in the paraelectric material layer may include, for example, at least one of hafnium oxide, zirconium oxide, and aluminum oxide, but is not limited thereto.

The ferroelectric material layer and the paraelectric material layer may include the same material. The ferroelectric material layer may have the ferroelectric characteristics, but the paraelectric material layer may not have the ferroelectric characteristics. For example, when the ferroelectric material layer and the paraelectric material layer include the hafnium oxide, a crystal structure of the hafnium oxide included in the ferroelectric material layer is different from a crystal structure of the hafnium oxide included in the paraelectric material layer.

The ferroelectric material layer may have a thickness having the ferroelectric characteristics. The thickness of the ferroelectric material layer may be, for example, 0.5 to 10 nm, but is not limited thereto. Since a critical thickness representing the ferroelectric characteristics may vary for each ferroelectric material, the thickness of the ferroelectric material layer may vary depending on the ferroelectric material.

As an example, the gate insulating layer 130 may include one ferroelectric material layer. As another example, the gate insulating layer 130 may include a plurality of ferroelectric material layers spaced apart from each other. The gate insulating layer 130 may have a stacked layer structure in which a plurality of ferroelectric material layers and a plurality of paraelectric material layers are alternately stacked.

The gate capping pattern 145 may be disposed on the upper surface of the gate electrode 120 and the upper surface of the gate spacer 140. An upper surface of the gate capping pattern 145 may be an upper surface GS_US of the gate structure. The gate capping pattern 145 may include, for example, at least one of silicon nitride (SiN), silicon oxynitride (SiON), silicon oxide (SiO$_2$), silicon carbonitride (SiCN), silicon oxycarbonitride (SiOCN), and a combination thereof.

Unlike illustrated, the gate capping pattern 145 may be disposed between the gate spacers 140. In this case, the upper surface of the gate capping pattern 145 may be on the same plane as the upper surface of the gate spacer 140. In this case, the upper surface GS_US of the gate structure may include the upper surface of the gate capping pattern 145 and the upper surface of the gate spacer 140.

The source/drain pattern 150 may be positioned on the substrate 100. The source/drain pattern 150 may be formed on the first active pattern AP1. The source/drain pattern 150 is connected to the first active pattern AP1. A bottom surface 150_BS of the first source/drain pattern is in contact with the first active pattern AP1.

The source/drain pattern 150 may be disposed on a side surface of the gate structure GS. The source/drain pattern 150 may be disposed between the gate structures GS.

For example, the source/drain pattern 150 may be disposed on both sides of the gate structure GS. Unlike illustrated, the source/drain pattern 150 may be disposed on one side of the gate structure GS and may not be disposed on the other side of the gate structure GS.

The source/drain pattern 150 may include an epitaxial pattern. The source/drain pattern 150 may include a semiconductor material. The source/drain pattern 150 may be included in a source/drain of the transistor using the first active pattern AP1 as a channel region.

The source/drain pattern 150 may be connected to a channel region used as a channel among the first active patterns AP1. Although the source/drain pattern 150 is illustrated as a merged pattern of three epitaxial patterns formed on the respective first active patterns AP1, it is only for convenience of explanation and the present disclosure is not limited thereto That is, the epitaxial patterns formed on the respective first active patterns AP1 may be isolated from each other.

As an example, an air gap may be disposed in a space between the field insulating layer 105 and the merged source/drain pattern 150. As another example, the space between the field insulating layer 105 and the merged source/drain pattern 150 may be filled with an insulating material.

Although not illustrated, the source/drain pattern as described above may be disposed on the second active pattern AP2 between the gate structures GS.

A source/drain etching stop layer 160 may extend along the upper surface of the field insulating layer 105, a sidewall of the gate structure GS, and a profile of the source/drain pattern 150. The source/drain etching stop layer 160 may be disposed on the upper surface of the source/drain pattern 150 and on the sidewall of the source/drain pattern 150.

The source/drain etching stop layer 160 may include a material having an etching selectivity with respect to a first interlayer insulating layer 190, which will be described later. The source/drain etching stop layer 160 may include, for example, at least one of silicon nitride (SiN), silicon oxynitride (SiON), silicon oxycarbonitride (SiOCN), silicon boronitride (SiBN), silicon oxyboronitride (SiOBN), silicon oxycarbide (SiOC), and a combination thereof.

A first interlayer insulating layer 190 is disposed on the source/drain etching stop layer 160. The first interlayer insulating layer 190 may be formed on the field insulating layer 105. The first interlayer insulating layer 190 may be disposed on the source/drain pattern 150. The first interlayer insulating layer 190 may not cover the upper surface GS_US of the gate structure. For example, an upper surface of the first interlayer insulating layer 190 may be on the same plane as the upper surface GS_US of the gate structure.

The first interlayer insulating layer 190 may include, for example, at least one of silicon oxide, silicon nitride, silicon oxynitride, and a low-k material. The low-k material may include, for example, fluorinated tetraethylorthosilicate (FTEOS), hydrogen silsesquioxane (HSQ), bis-benzocyclobutene (BCB), tetramethylorthosilicate (TMOS), octamethylcyclotetrasiloxane (OMCTS), hexamethyldisiloxane (HMDS), trimethylsilyl borate (TMSB), diacetoxyditertiarybutosiloxane (DADBS), trimethylsilyl phosphate (TMSP), polytetrafluoroethylene (PTFE), tonen silazene (TOSZ), fluoride silicate glass (FSG), polyimide nanofoams such as polypropylene oxide, carbon doped silicon oxide (CDO), organo silicate glass (OSG), SiLK, amorphous fluorinated carbon, silica aerogels, silica xerogels, mesoporous silica, or a combination thereof, but is not limited thereto.

A first source/drain contact 170 may be disposed on the first active region RX1. A second source/drain contact 270 may be disposed on the second active region RX2. The first source/drain contact 170 may be connected to the source/drain pattern 150 formed in the first active region RX1. Although not illustrated, the second source/drain contact 270 may be connected to a source/drain pattern formed in the second active region RX2.

Unlike illustrated, a portion of the first source/drain contact 170 may be directly connected to a portion of the second source/drain contact 270. That is, in the semiconductor device according to some embodiments, at least one or more source/drain contacts may be disposed across the first active region RX1 and the second active region RX2.

Since the second source/drain contact 270 is substantially the same as the first source/drain contact 170, the following description will be described using the first source/drain contact 170 on the first active pattern AP1.

The gate contact 180 may be disposed in the gate structure GS. The gate contact 180 may be connected to the gate electrode 120 included in the gate structure GS.

The gate contact 180 may be disposed at a position overlapping the gate structure GS. In the semiconductor device according to some embodiments, at least a portion of the gate contact 180 may be disposed at a position overlapping at least one of the first active region RX1 and the second active region RX2.

For example, in a plan view, the gate contact 180 may be disposed at a position that entirely overlaps the first active region RX1 or the second active region RX2.

The first source/drain contact 170 may pass through the source/drain etching stop layer 160 to be connected to the source/drain pattern 150. The first source/drain contact 170 may be disposed on the source/drain pattern 150.

The first source/drain contact 170 may be disposed in the first interlayer insulating layer 190. The first source/drain contact 170 may be surrounded by the first interlayer insulating layer 190.

A contact silicide layer 155 may be disposed between the first source/drain contact 170 and the source/drain pattern 150. The contact silicide layer 155 is illustrated as being formed along a profile of an interface between the source/drain pattern 150 and the first source/drain contact 170, but is not limited thereto. The contact silicide layer 155 may include a metal silicide material.

The first interlayer insulating layer 190 does not cover an upper surface of the first source/drain contact 170. For example, the upper surface of the first source/drain contact 170 may not protrude upward from the upper surface GS_US of the gate structure. The upper surface of the first source/drain contact 170 may be on the same plane as the upper surface GS_US of the gate structure. Unlike illustrated, as another example, the upper surface of the first source/drain contact 170 may protrude upward from the upper surface GS_US of the gate structure.

The first source/drain contact 170 may include a source/drain barrier layer 170a and a source/drain filling layer 170b on the source/drain barrier layer 170a. The source/drain barrier layer 170a may extend along sidewalls and a bottom surface of the source/drain filling layer 170b.

A bottom surface 170_BS of the source/drain contact is illustrated as having a wavy shape, but is not limited thereto. Unlike illustrated, the bottom surface 170_BS of the source/drain contact may also have a flat shape.

Based on the upper surface AP1_US of the first active pattern, an upper surface of the source/drain barrier layer 170a is illustrated as being positioned at substantially the same height as an upper surface of the source/drain filling layer 170b, but is not limited thereto.

Unlike illustrated, the upper surface of the source/drain barrier layer 170a may be lower than the upper surface of the source/drain filling layer 170b based on the upper surface AP1_US of the first active pattern.

The source/drain barrier layer 170a may include, for example, at least one of tantalum (Ta), tantalum nitride (TaN), titanium (Ti), titanium nitride (TiN), titanium silicon nitride (TiSiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh), and a two-dimensional (2D) material. In the semiconductor device according to some embodiments, the 2D material may be a metallic material and/or a semiconductor material. The 2D material may include a two-dimensional allotrope or a two-dimensional compound, and may include, for example, at least one of graphene, molybdenum disulfide ($MoS_2$), molybdenum diselenide ($MoSe_2$), tungsten diselenide ($WSe_2$), and tungsten disulfide ($WS_2$), but is not limited thereto. That is, since the above-described 2D material is only listed as an example, the 2D material that may be included in the semiconductor device of the present disclosure is not limited by the above-described material.

The source/drain filling layer 170b may include, for example, at least one of aluminum (Al), tungsten (W), cobalt (Co), ruthenium (Ru), silver (Ag), gold (Au), manganese (Mn), and molybdenum (Mo).

The first source/drain contact 170 is illustrated as including a plurality of conductive layers, but is not limited thereto. Unlike illustrated, the first source/drain contact 170 may be a single layer.

A contact liner 175 is disposed on the source/drain pattern 150. The contact liner 175 is disposed between the source/drain contact 170 and the first interlayer insulating layer 190.

The contact liner 175 may extend along a sidewall 170_SW of the first source/drain contact. The contact liner 175 is not formed along the bottom surface 170_BS of the source/drain contact.

The contact liner 175 is in contact with the first source/drain contact 170. The contact liner 175 is in contact with the sidewall 170_SW of the first source/drain contact. For example, the contact liner 175 may be in contact with the source/drain barrier layer 170a.

The contact liner 175 may be in contact with the source/drain etching stop layer 160. In FIG. 2, the contact liner 175 is disposed between the first source/drain contact 170 and the source/drain etching stop layer 160. The contact liner 175 may extend up to the upper surface GS_US of the gate structure.

In the semiconductor device according to some embodiments, the contact liner 175 does not penetrate through the source/drain etching stop layer 160. The contact liner 175 does not include a portion that is in the source/drain etching stop layer 160. In other words, the contact liner 175 does not extend to the source/drain pattern 150. For example, the contact liner 175 may not be in contact with the contact silicide layer 155.

In FIGS. 2 and 3, the contact liner 175 extends to the source/drain etching stop layer 160. The lowermost portion of the contact liner 175 may be in contact with the source/drain etching stop layer 160.

The contact liner 175 includes an insulating material. For example, the contact liner 175 may be formed of an insulating material.

The contact liner 175 may include an insulating material including carbon (C) and oxygen (O). For example, the contact liner 175 may include, for example, silicon oxycarbide (SiOC). As another example, the contact liner 175 may include silicon oxycarbide (SiOC) doped with hydrogen (H).

As a distance (e.g., a distance in the third direction Z) from the upper surface GS_US of the gate structure increases, a concentration of carbon contained in the contact liner 175 varies. For example, as the distance from the upper surface GS_US of the gate structure increases, the concentration of carbon contained in the contact liner 175 may decrease. The concentration of carbon contained in the contact liner 175 may be an atomic percent (at %), but is not limited thereto.

In FIG. 2, the contact liner 175 may include a first point PS1 and a second point PS2. A height H11 from the upper surface AP1_US of the first active pattern to the first point PS1 is smaller than a height H12 from the upper surface AP1_US of the first active pattern to the second point PS2.

In FIG. 3, the contact liner 175 may include a third point PS3 and a fourth point PS4. A height H21 from the bottom surface 150_BS of the source/drain pattern to the third point PS3 is smaller than a height H22 from the bottom surface 150_BS of the source/drain pattern to the fourth point PS4.

In FIG. 6, a concentration (indicated by 'X') of carbon contained in the contact liner 175 at the first point PS1 of the contact liner 175 is different from a concentration of carbon contained in the contact liner 175 at the second point PS2 of the contact liner 175. For example, the concentration of carbon contained in the contact liner 175 at the first point PS1 of the contact liner 175 is smaller than the concentration of carbon contained in the contact liner 175 at the second point PS2 of the contact liner 175. In addition, a ratio (C/O ratio, indicated as 'O') of carbon (C) to oxygen (O) at the first point PS1 of the contact liner 175 is smaller than a ratio of carbon (C) to oxygen (O) at the second point PS2 of the contact liner 175.

Similarly, the concentration of carbon contained in the contact liner 175 at the third point PS3 of the contact liner 175 is smaller than the concentration of carbon contained in the contact liner 175 at the fourth point PS4 of the contact liner 175. In addition, a ratio of carbon (C) to oxygen (O) at the third point PS3 of the contact liner 175 is smaller than a ratio of carbon (C) to oxygen (O) at the fourth point PS4 of the contact liner 175.

In the semiconductor device according to some embodiments, as it moves away from the upper surface GS_US of the gate structure increases, a thickness of the contact liner 175 may be constant. The contact liner 175 extending along the sidewall 170_SW of the first source/drain contact may have a uniform thickness. For example, a thickness t11 of the contact liner 175 at the first point PS1 of the contact liner 175 may be equal to a thickness t12 of the contact liner 175 at the second point PS2 of the contact liner 175. Although not illustrated, a thickness of the contact liner 175 at the third point PS3 of the contact liner 175 may be equal to a thickness of the contact liner 175 at the fourth point PS4 of the contact liner 175. The thickness t11 of the contact liner 175 may be a thickness of the contact liner 175 at the height H11, and the thickness t12 of the contact liner 175 may be a thickness of the contact liner 175 at the height H12.

As the concentration of carbon contained in the contact liner 175 decreases, a dielectric constant of the contact liner 175 may also decrease. That is, a capacitance value between the first source/drain contact 170 and the gate electrode 120 may decrease. Accordingly, AC characteristics of the semiconductor device may be improved.

In addition, as the concentration of carbon contained in the contact liner 175 decreases, etching resistance of the contact liner 175 may decrease. More specifically, when the contact liner 175 on the upper surface of the source/drain pattern 150 is not removed while a contact hole (170_H in FIG. 31) is formed, the source/drain contact connected to the source/drain pattern 150 cannot be formed. However, as the etching resistance of the contact liner 175 adjacent to the source/drain pattern 150 decreases, the contact liner 175 on the upper surface of the source/drain pattern 150 may be easily removed. Accordingly, the source/drain contact connected to the source/drain pattern 150 may be stably formed. That is, the performance and reliability of the semiconductor device may be improved.

The gate contact 180 may be disposed on the gate electrode 120. The gate contact 180 may penetrate through the gate capping pattern 145 to be connected to the gate electrode 120.

As an example, an upper surface of the gate contact 180 may be on the same plane as the upper surface GS_US of the gate structure. Unlike illustrated, as another example, the upper surface of the gate contact 180 may protrude upward from the upper surface GS_US of the gate structure.

The gate contact 180 may include a gate barrier layer 180a and a gate filling layer 180b on the gate barrier layer 180a. Descriptions of materials included in the gate barrier layer 180a and the gate filling layer 180b may be the same as those of the source/drain barrier layer 170a and the source/drain filling layer 170b.

A first etching stop layer 196 may be disposed on the first interlayer insulating layer 190, the gate structure GS, the source/drain contact 170, and the gate contact 180. A second interlayer insulating layer 191 may be disposed on the first etching stop layer 196.

The first etching stop layer 196 may include a material having an etching selectivity with respect to the second interlayer insulating layer 191. The first etching stop layer 196 may include, for example, at least one of silicon nitride (SiN), silicon oxynitride (SiON), silicon oxycarbonitride (SiOCN), silicon boronitride (SiBN), silicon oxyboronitride (SiOBN), silicon oxycarbide (SiOC), aluminum oxide (AlO), aluminum nitride (AlN), aluminum oxycarbide (AlOC), and a combination thereof. The first etching stop layer 196 is illustrated as a single layer, but is not limited thereto. Unlike illustrated, the first etching stop layer 196 may not be formed. The second interlayer insulating layer 191 may include, for example, at least one of silicon oxide, silicon nitride, silicon carbonitride, silicon oxynitride, and a low-k material.

A via plug 206 may be disposed in the second interlayer insulating layer 191. The via plug 206 may pass through the first etching stop layer 196 to be directly connected to the first source/drain contact 170 and the gate contact 180.

The via plug 206 may include a via barrier layer 206a and a via filling layer 206b. The via barrier layer 206a may extend along sidewalls and a bottom surface of the via filling layer 206b. The via barrier layer 206a may include, for example, at least one of tantalum (Ta), tantalum nitride (TaN), titanium (Ti), titanium nitride (TiN), titanium silicon nitride (TiSiN), nickel (Ni), nickel boron (NiB), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh), and a two-dimensional (2D) material. The via filling layer 206b may include, for example, at least one of aluminum (Al), tungsten (W), cobalt (Co), ruthenium (Ru), copper (Cu), silver (Ag), gold (Au), manganese (Mn), and molybdenum (Mo).

A second etching stop layer 197 may be disposed between the second interlayer insulating layer 191 and the third interlayer insulating layer 192. The second etching stop layer 197 may extend along the upper surface of the second interlayer insulating layer 191.

The second etching stop layer 197 may include a material having an etching selectivity with respect to the third interlayer insulating layer 192. A description of the material included in the second etching stop layer 197 may be the same as that of the first etching stop layer 196. The second etching stop layer 197 is illustrated as a single layer, but is not limited thereto. Unlike illustrated, the second etching stop layer 197 may not be formed. The third interlayer insulating layer 192 may include, for example, at least one of silicon oxide, silicon nitride, silicon carbonitride, silicon oxynitride, and a low-k material.

A wiring line 207 may be disposed in the third interlayer insulating layer 192. The wiring line 207 is connected to the via plug 206. The wiring line 207 may be in contact with the via plug 206.

The wiring line 207 may include a wiring barrier layer 207a and a wiring filling layer 207b. The wiring barrier layer 207a may include, for example, at least one of tantalum (Ta), tantalum nitride (TaN), titanium (Ti), titanium nitride (TiN), titanium silicon nitride (TiSiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh), and a two-dimensional (2D) material. The wiring filling layer 207b may each include, for example, at least one of aluminum (Al), tungsten (W), cobalt (Co), ruthenium (Ru), copper (Cu), silver (Ag), gold (Au), manganese (Mn), and molybdenum (Mo).

Unlike illustrated, the wiring barrier layer 207a may not be disposed between the via filling layer 206b and the wiring filling layer 207b. Although not illustrated, a first connection contact connecting the via plug 206 and the first source/drain contact 170 may be further disposed between the via plug 206 and the first source/drain contact 170. In addition, a second connection contact connecting the via plug 206 and the gate contact 180 may be further disposed between the via plug 206 and the gate contact 180.

Figure 7:
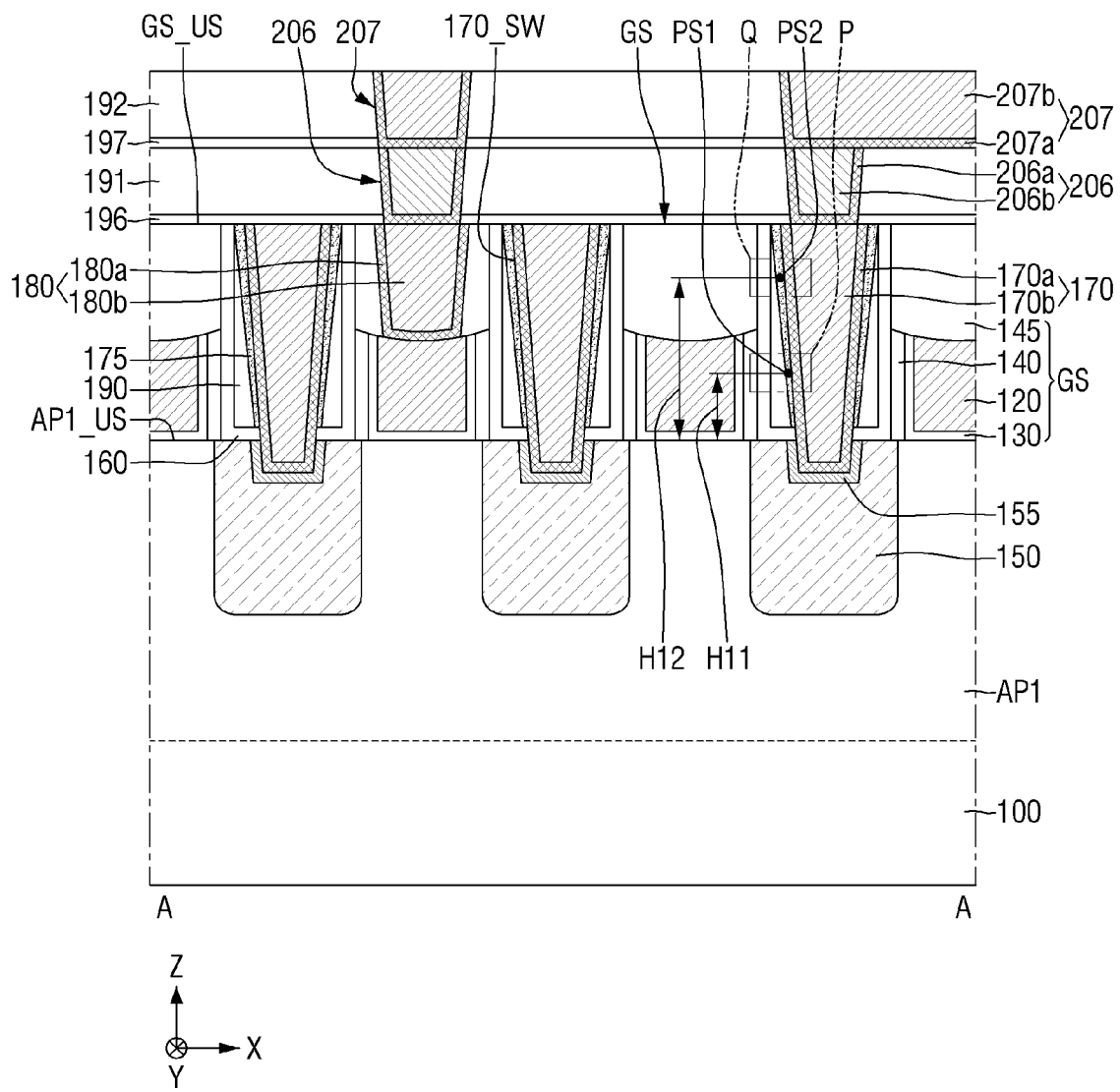
FIGS. 7 to 9 are views of a semiconductor device according to some embodiments.
Figure 8:
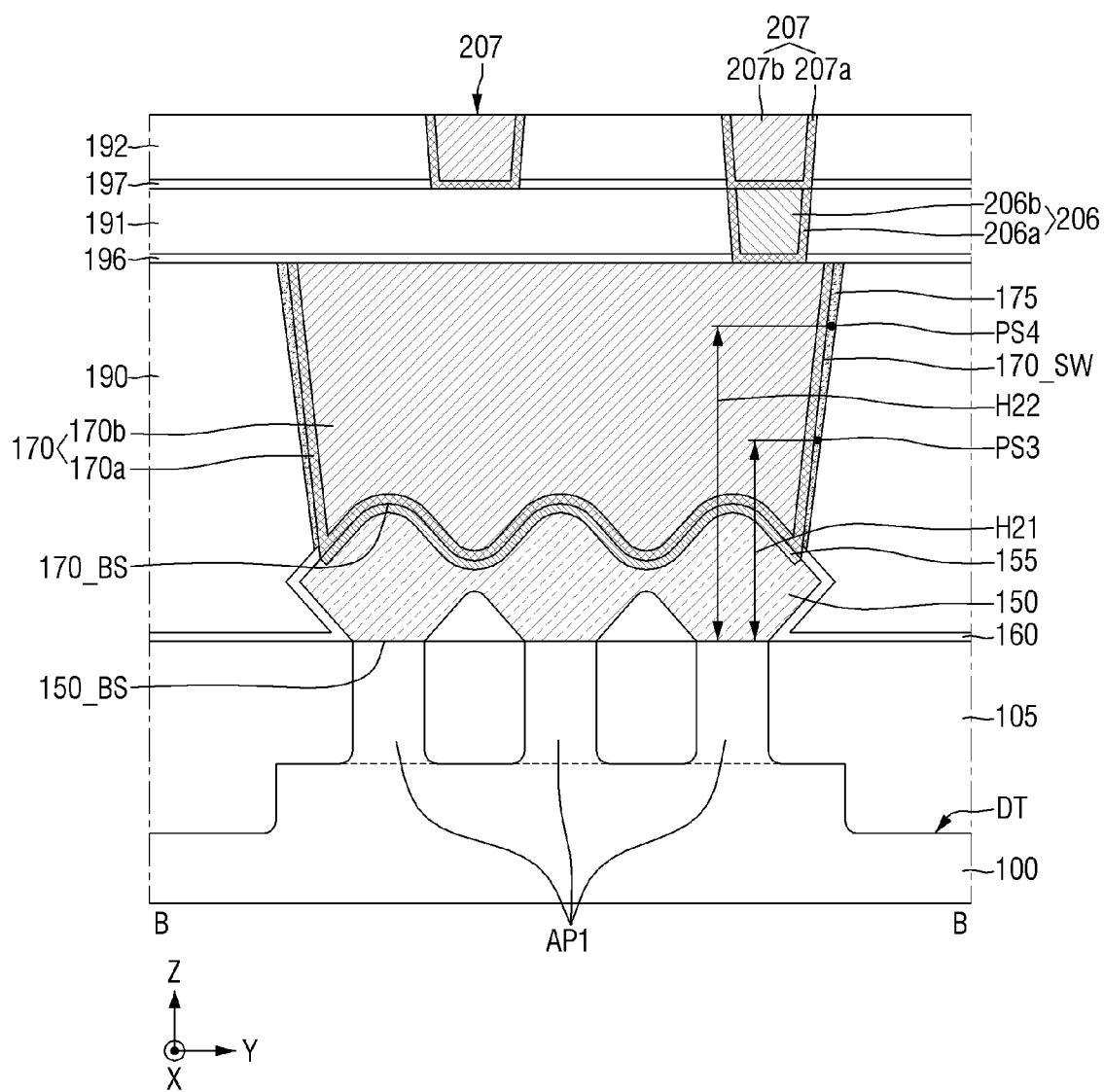
Figure 9:
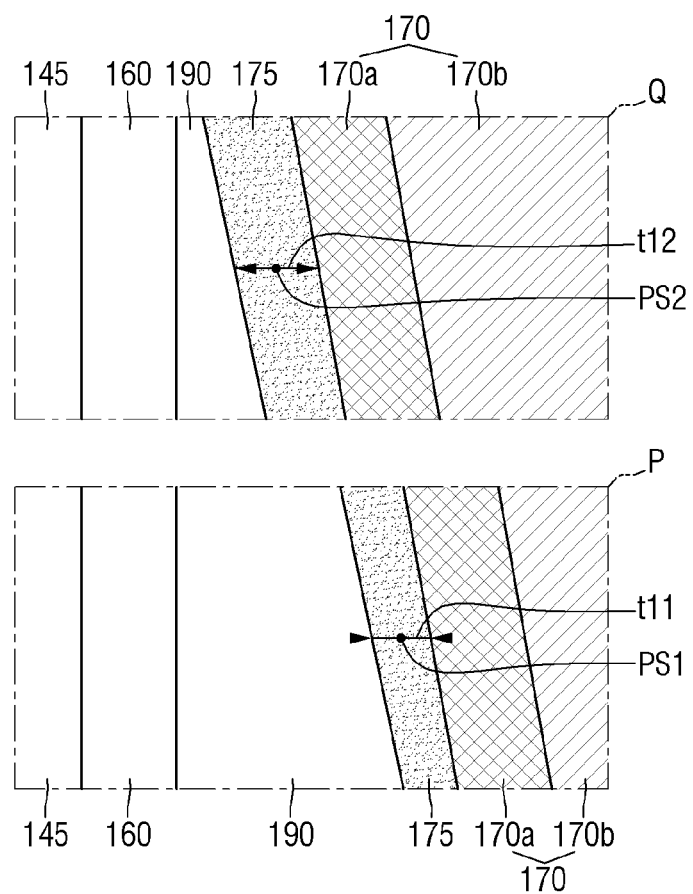

FIGS. 7 to 9 are views of a semiconductor device according to some embodiments. For convenience of explanation, differences from those described with reference to FIGS. 1 to 6 will be mainly described.

Referring to FIGS. 7 to 9, in the semiconductor device according to some embodiments, as a distance (e.g., a distance in the third direction Z) from the upper surface GS_US of the gate structure increases, the thickness of the contact liner 175 may vary.

For example, as a distance from the upper surface GS_US of the gate structure increases, the thickness of the contact liner 175 may decrease.

The thickness t11 of the contact liner 175 at the first point PS1 of the contact liner 175 is smaller than the thickness t12 of the contact liner 175 at the second point PS2 of the contact liner 175.

The thickness of the contact liner 175 at the third point PS3 of the contact liner 175 is smaller than the thickness of the contact liner 175 at the fourth point PS4 of the contact liner 175.

Figure 10:
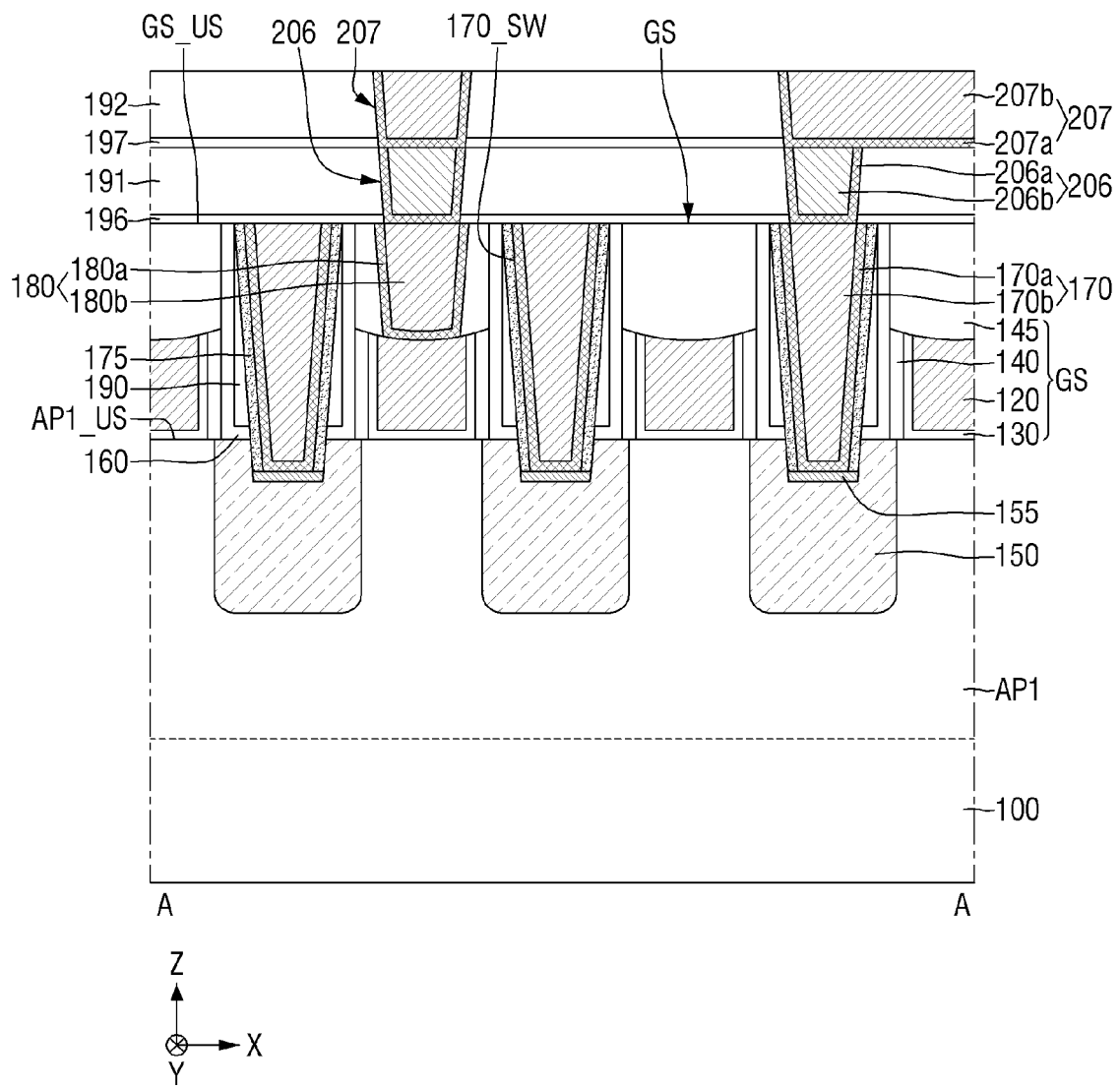
FIGS. 10 and 11 are views of a semiconductor device according to some embodiments.
Figure 11:
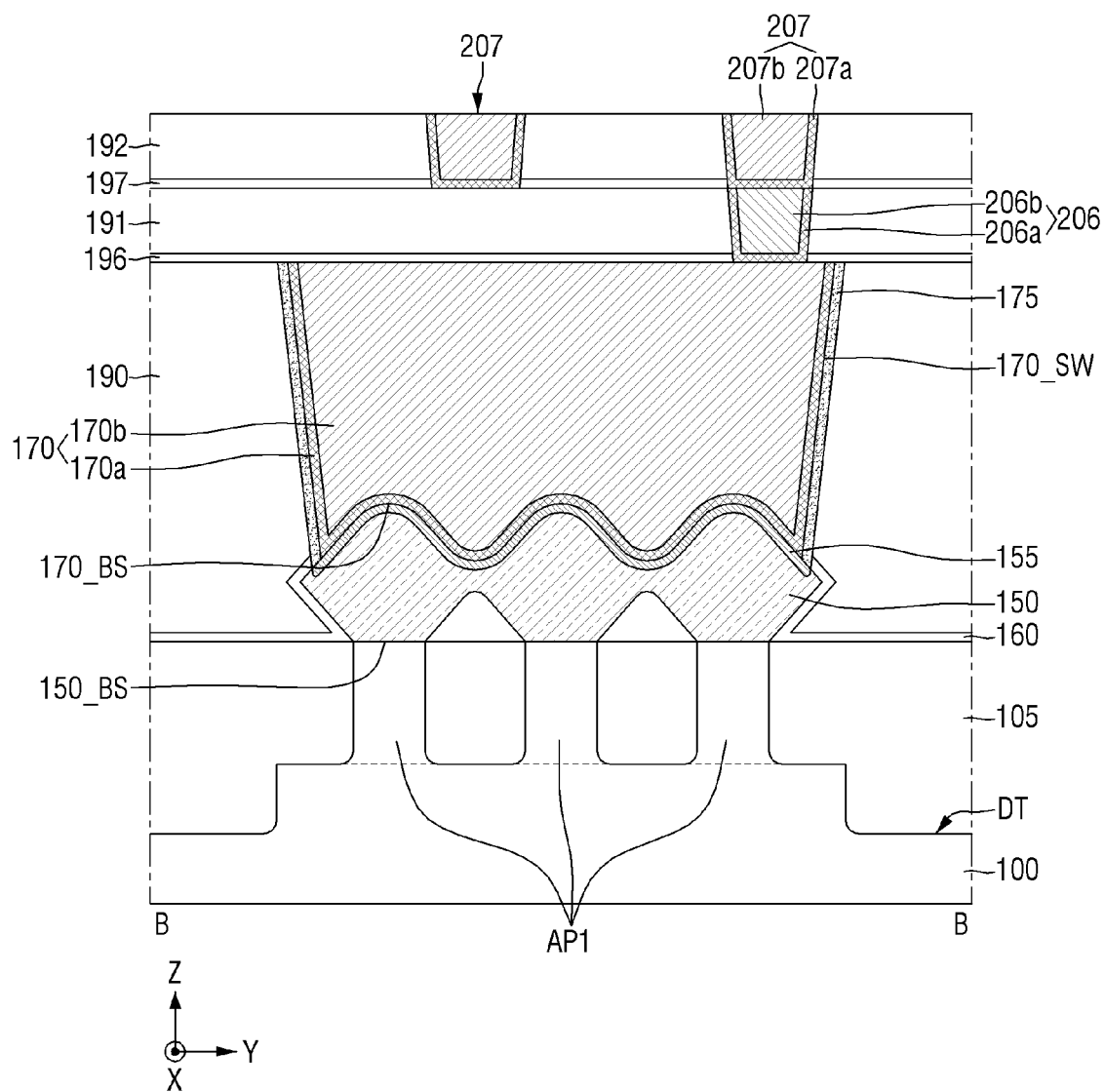

FIGS. 10 and 11 are views of a semiconductor device according to some embodiments. For convenience of explanation, differences from those described with reference to FIGS. 1 to 6 will be mainly described.

Referring to FIGS. 10 and 11, in the semiconductor device according to some embodiments, the contact liner 175 passes through the source/drain etching stop layer 160.

The contact liner 175 penetrates through the source/drain etching stop layer 160 and extends to the source/drain pattern 150. For example, the contact liner 175 is in contact with the contact silicide layer 155.

The source/drain etching stop layer 160 may include a lower surface facing the source/drain pattern 150 and an upper surface facing the first interlayer insulating layer 190. In a portion through which the contact liner 175 penetrates, the lowermost portion of the contact liner 175 may be lower than the upper surface of the source/drain etching stop layer 160.

Figure 12:
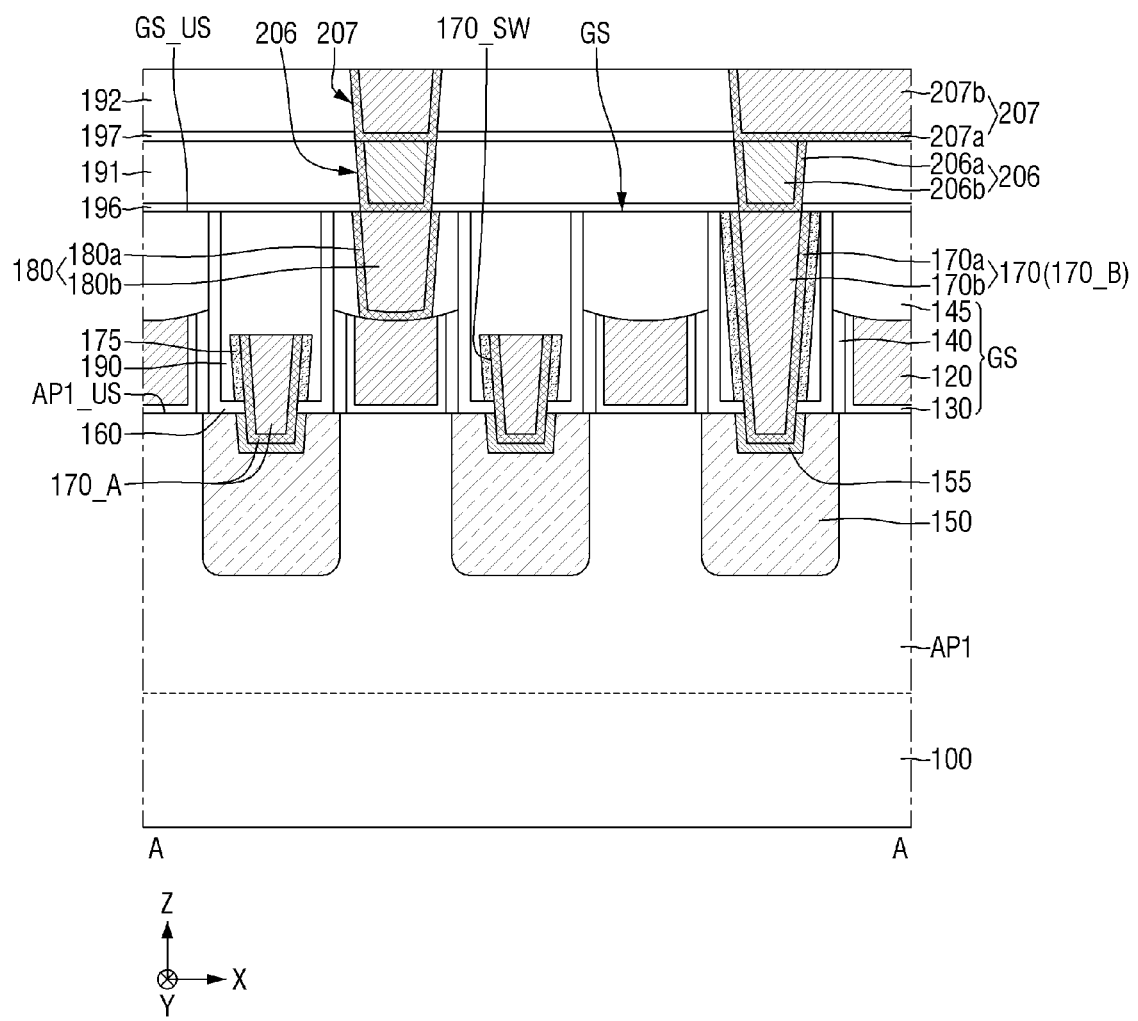
FIGS. 12 and 13 are views of a semiconductor device according to some embodiments.
Figure 13:
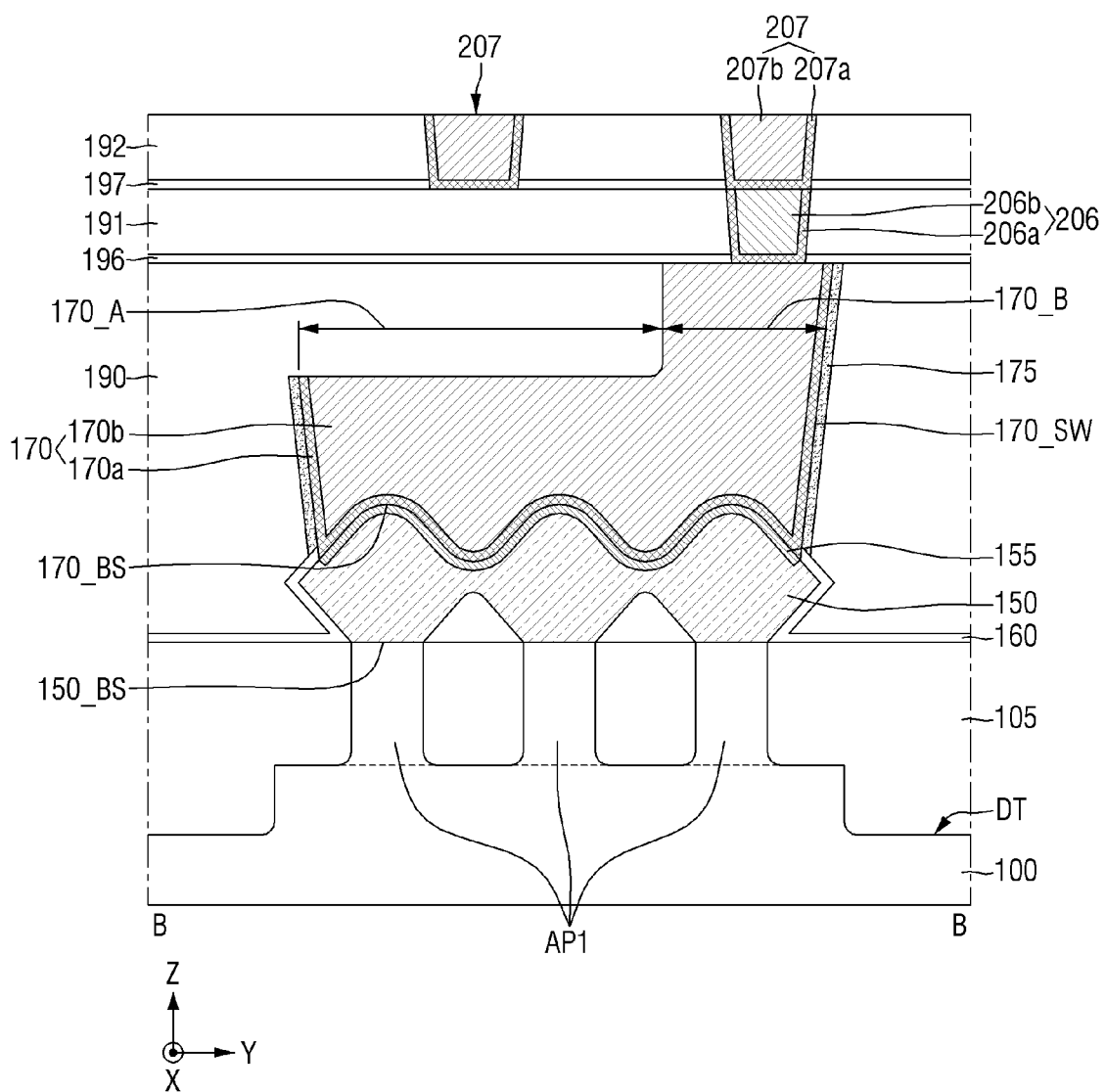

FIGS. 12 and 13 are views of a semiconductor device according to some embodiments. For convenience of explanation, differences from those described with reference to FIGS. 1 to 6 will be mainly described.

Referring to FIGS. 12 and 13, in the semiconductor device according to some embodiments, the first source/drain contact 170 may include a first portion 170_A and a second portion 170_B.

The first portion 170_A of the first source/drain contact may be directly connected to the second portion 170_B of the first source/drain contact.

The second portion 170_B of the first source/drain contact is a portion to which the via plug 206 is landed. The first source/drain contact 170 may be connected to the wiring line 207 through the second portion 170_B of the first source/drain contact. The first portion 170_A of the first source/drain contact is not a portion to which the via plug 206 is landed.

For example, in the cross-sectional view as illustrated in FIG. 12, the second portion 170_B of the first source/drain contact may be positioned at a portion connected to the via plug 206. The first portion 170_A of the first source/drain contact may be positioned at a portion not connected to the via plug 206.

In addition, in order to prevent the gate contact 180 and the first source/drain contact 170 from being short-circuited, on both sides of the gate structure GS in the portion connected to the gate contact 180, the first portion 170_A of the first source/drain contact may be positioned and the second portion 170_B of the first source/drain contact may not be positioned. That is, in the cross-sectional view as illustrated in FIG. 12, on both sides of the gate structure GS connected to the gate contact 180, the first portion 170_A of the first source/drain contact may be positioned and the second portion 170_B of the first source/drain contact may not be positioned.

An upper surface of the second portion 170_B of the first source/drain contact is higher than the first portion 170_A of the first source/drain contact. In FIG. 13, based on the upper surface of the field insulating layer 105, the upper surface of the second portion 170_B of the first source/drain contact is higher than the first portion 170_A of the first source/drain contact. For example, an upper surface of the first source/drain contact 170 may be an upper surface of the second portion 170_B of the first source/drain contact.

In FIG. 13, the first source/drain contact 170 is illustrated as having an L-shape, but is not limited thereto. Unlike illustrated, the first source/drain contact 170 may have a T-shape rotated by 180 degrees (e.g., an inverted T shape). In this case, the first portion 170_A of the first source/drain contact may be disposed on both sides of the second portion 170_B of the first source/drain contact.

The contact liner 175 extends along the sidewall 170_SW of the first source/drain contact. In the first portion 170_A of the first source/drain contact, the contact liner 175 does not protrude in the third direction Z from the upper surface of the first portion 170_A of the first source/drain contact. In the second portion 170_B of the first source/drain contact, the contact liner 175 may extend up to the upper surface of the first source/drain contact 170.

The first interlayer insulating layer 190 may not cover the upper surface of the second portion 170_B of the first source/drain contact. The first interlayer insulating layer 190 may cover the upper surface of the first portion 170_A of the first source/drain contact.

In FIG. 13, the first interlayer insulating layer 190 may include a first portion and a second portion. The first portion of the first interlayer insulating layer 190 may be a portion of the first interlayer insulating layer 190 overlapping the upper surface of the first portion 170_A of the first source/drain contact in the third direction Z. The second portion of the first interlayer insulating layer 190 may be a portion other than the first portion of the first interlayer insulating layer 190.

The first portion of the first interlayer insulating layer 190 and the second portion of the first interlayer insulating layer 190 are formed through different fabricating processes. The first source/drain contact 170 illustrated in FIG. 13 may be formed by removing a portion of the first source/drain contact 170 illustrated in FIG. 3. For example, by removing a portion of the first source/drain contact 170 illustrated in FIG. 3, the first portion 170_A of the first source/drain contact illustrated in FIG. 13 may be formed. A space on the upper surface of the first portion 170_A of the first source/drain contact may be filled with an insulating material to form the first portion of the first interlayer insulating layer 190.

Figure 14:
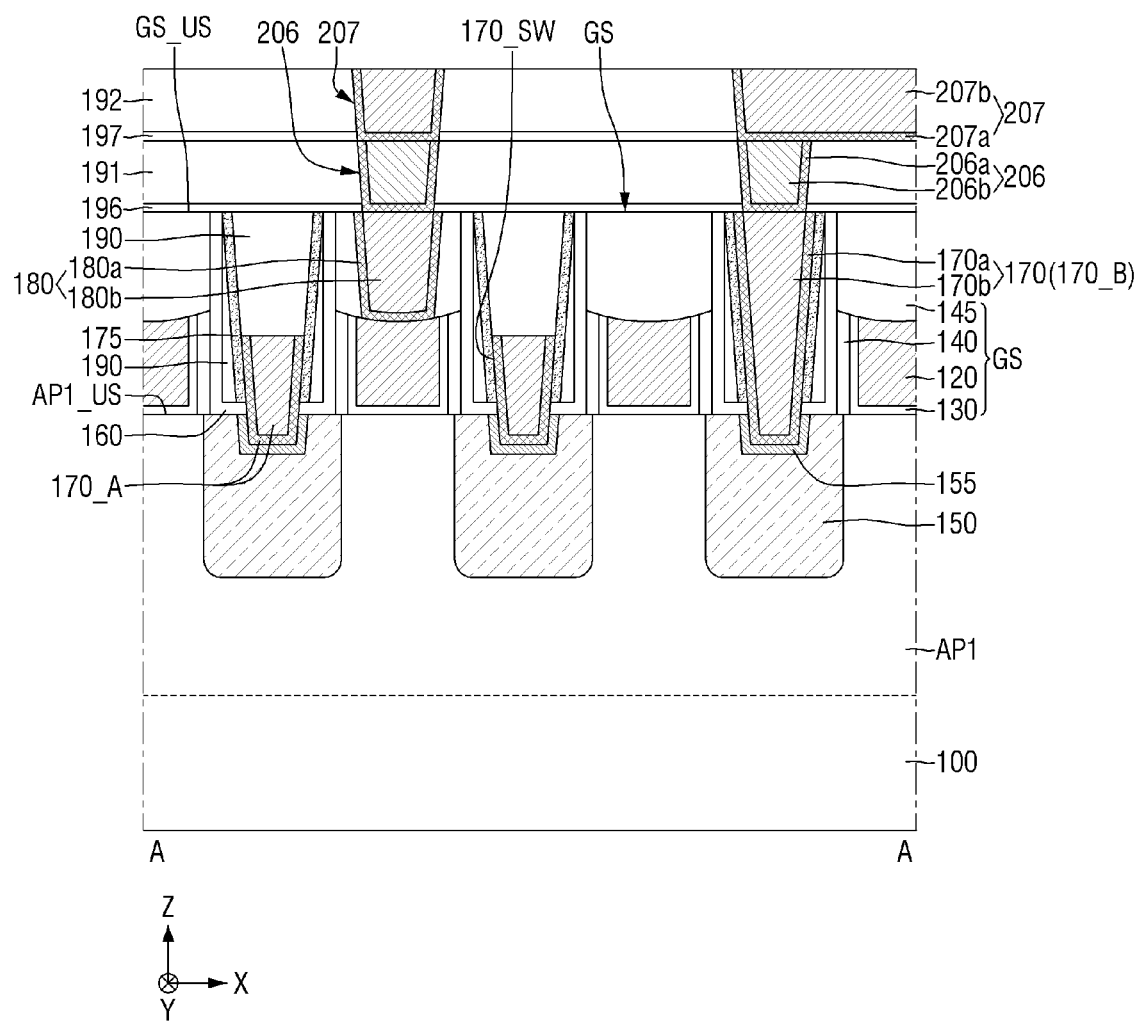
FIGS. 14 and 15 are views of a semiconductor device according to some embodiments.
Figure 15:
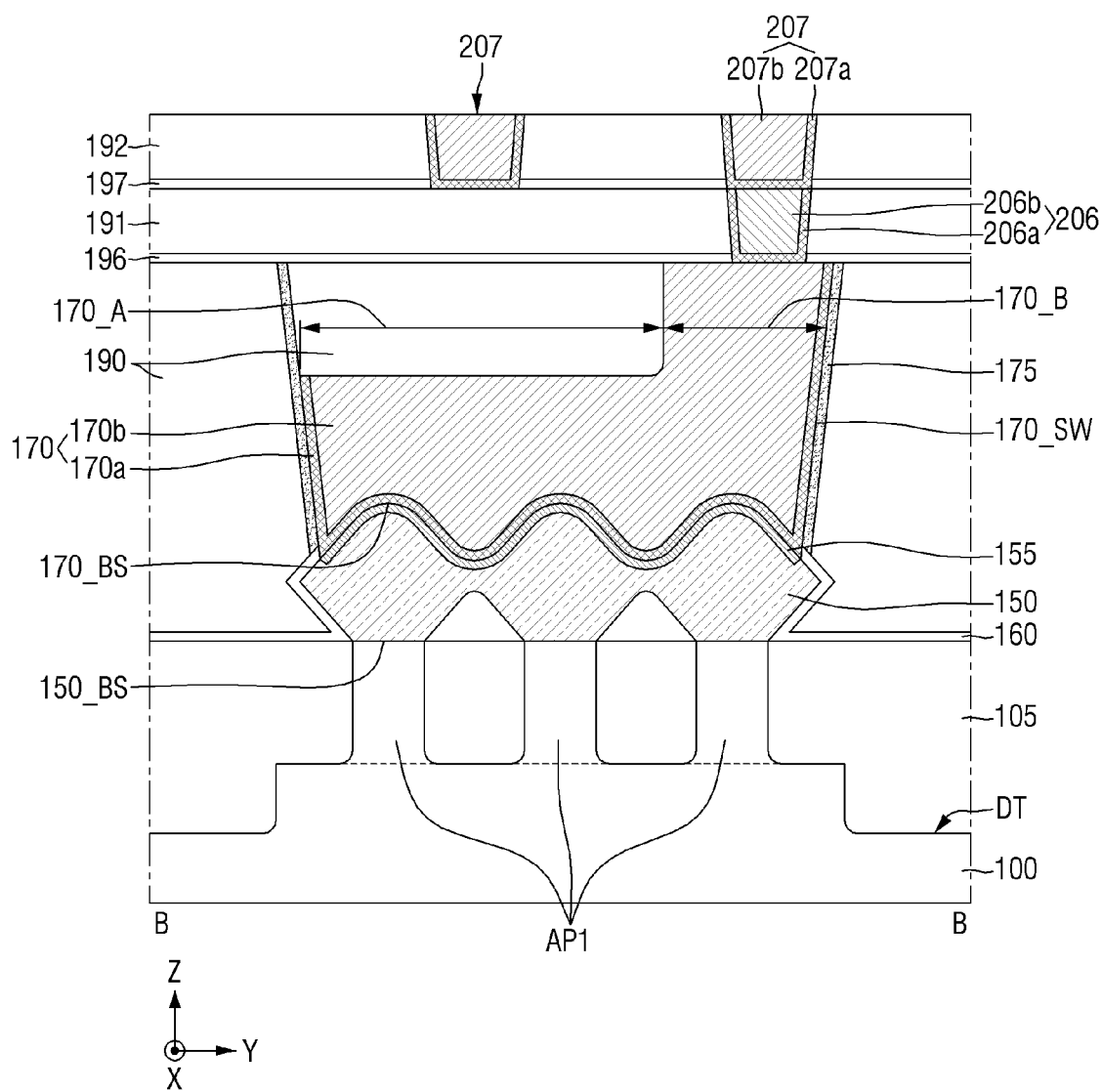

FIGS. 14 and 15 are views of a semiconductor device according to some embodiments. For convenience of explanation, differences from those described with reference to FIGS. 12 and 13 will be mainly described.

Referring to FIGS. 14 and 15, in the semiconductor device according to some embodiments, in the first portion 170_A of the first source/drain contact, the contact liner 175 protrudes in the third direction Z from the upper surface of the first portion 170_A of the first source/drain contact.

In the first portion 170_A of the first source/drain contact, the contact liner 175 is illustrated as extending up to the upper surface GS_US of the gate structure or the first etching stop layer 196, but is not limited thereto.

In FIG. 14, a portion of the first interlayer insulating layer 190 may be disposed on the upper surface of the first portion 170_A of the first source/drain contact and disposed between the contact liners 175. In addition, in FIG. 15, a portion of the first interlayer insulating layer 190 may be disposed between the second portion 170_B of the first source/drain contact and the contact liner 175. A portion of the first interlayer insulating layer 190 described above may correspond to the first portion of the first interlayer insulating layer 190 described with reference to FIGS. 12 and 13.

Figure 16:
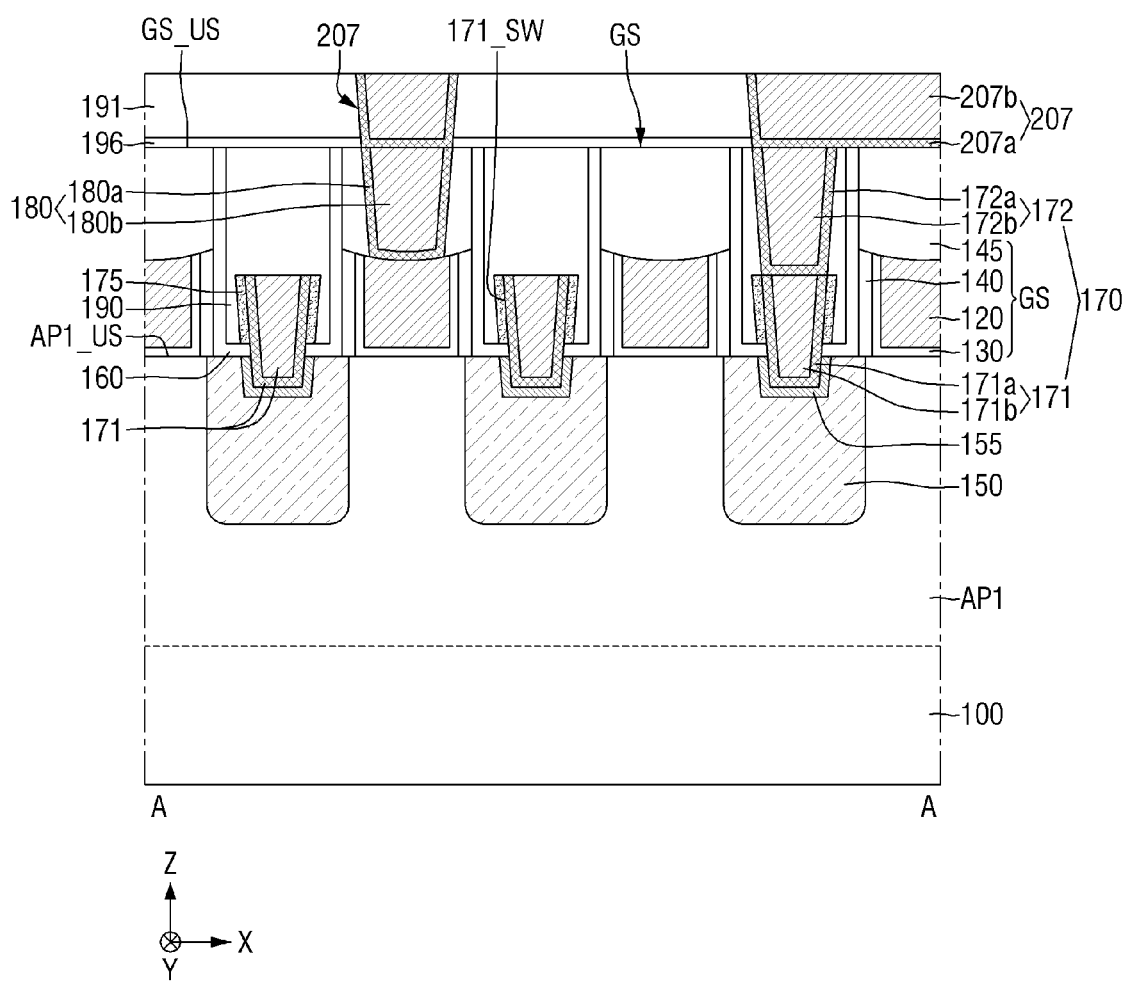
FIGS. 16 and 17 are views of a semiconductor device according to some embodiments.
Figure 17:
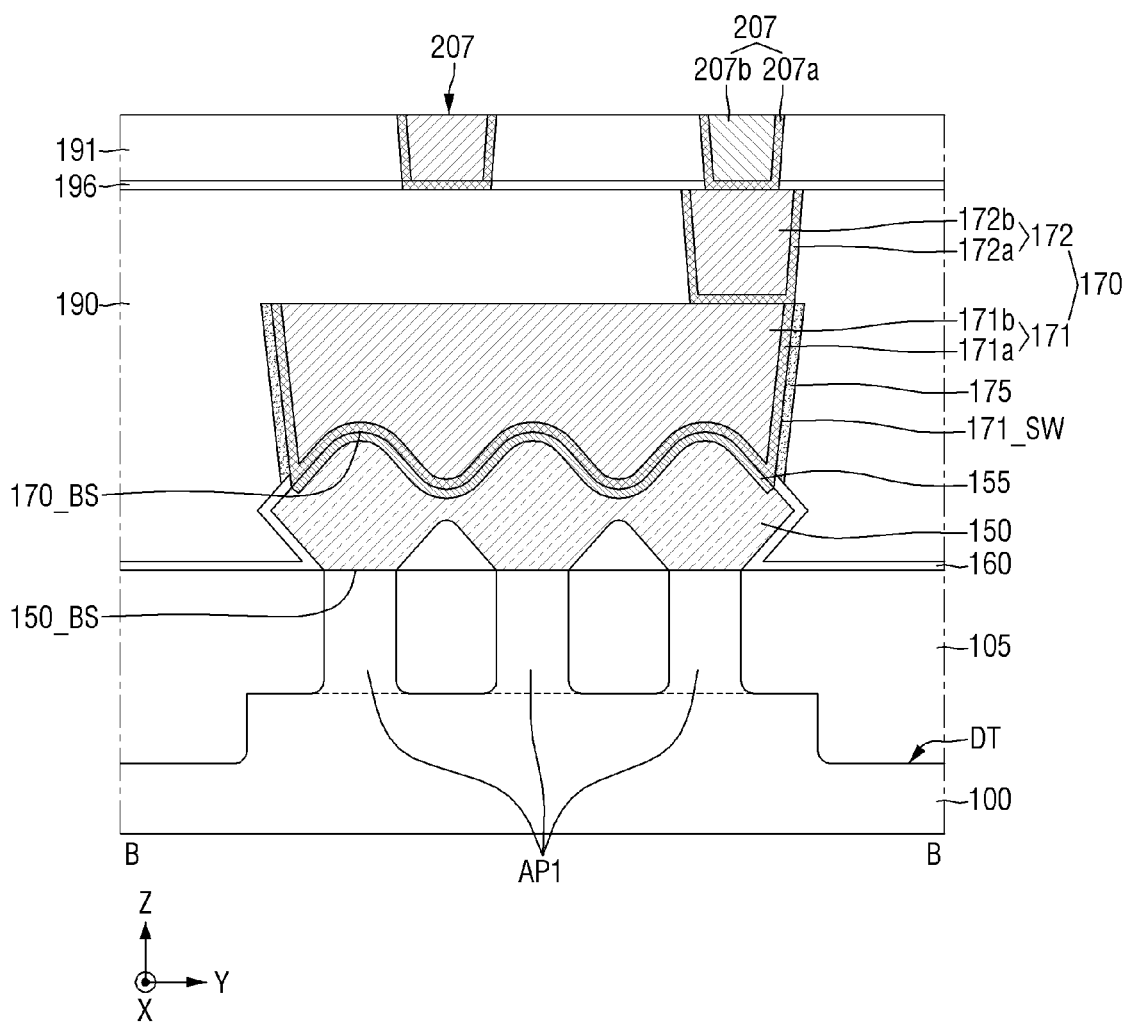

FIGS. 16 and 17 are views of a semiconductor device according to some embodiments. For convenience of explanation, differences from those described with reference to FIGS. 1 and 6 will be mainly described.

Referring to FIGS. 16 and 17, in the semiconductor device according to some embodiments, the first source/drain contact 170 may include a lower source/drain contact 171 and an upper source/drain contact 172.

The lower source/drain contact 171 may include a lower source/drain barrier layer 171a and a lower source/drain filling layer 171b. The upper source/drain contact 172 may include an upper source/drain barrier layer 172a and an upper source/drain filling layer 172b.

The upper surface of the first source/drain contact 170 may be an upper surface of the upper source/drain contact 172.

Descriptions of materials included in the lower source/drain barrier layer 171a and the upper source/drain barrier layer 172a may be the same as those of the source/drain barrier layer 170a. Descriptions of materials included in the lower source/drain filling layer 171b and the upper source/drain filling layer 172b may be the same as those of the source/drain filling layer 170b. Unlike illustrated, the upper source/drain contact 172 may be formed of a single layer.

The contact liner 175 may extend along a sidewall 171_SW of the lower source/drain contact.

As an example, the contact liner 175 may not extend along a sidewall of the upper source/drain contact 172. In this case, the contact liner 175 does not extend up to the upper surface GS_US of the gate structure.

Unlike illustrated, as another example, the contact liner 175 may extend along at least a portion the sidewall of the upper source/drain contact 172. As an example, the contact liner 175 may extend up to the upper surface GS_US of the gate structure. As another example, the contact liner 175 may not extend up to the upper surface GS_US of the gate structure.

The wiring line 207 may be connected to the first source/drain contact 170 and the gate contact 180 without the via plug (206 in FIG. 2). The wiring line 207 may be disposed in the first etching stop layer 196 and the second interlayer insulating layer 191.

Figure 18:
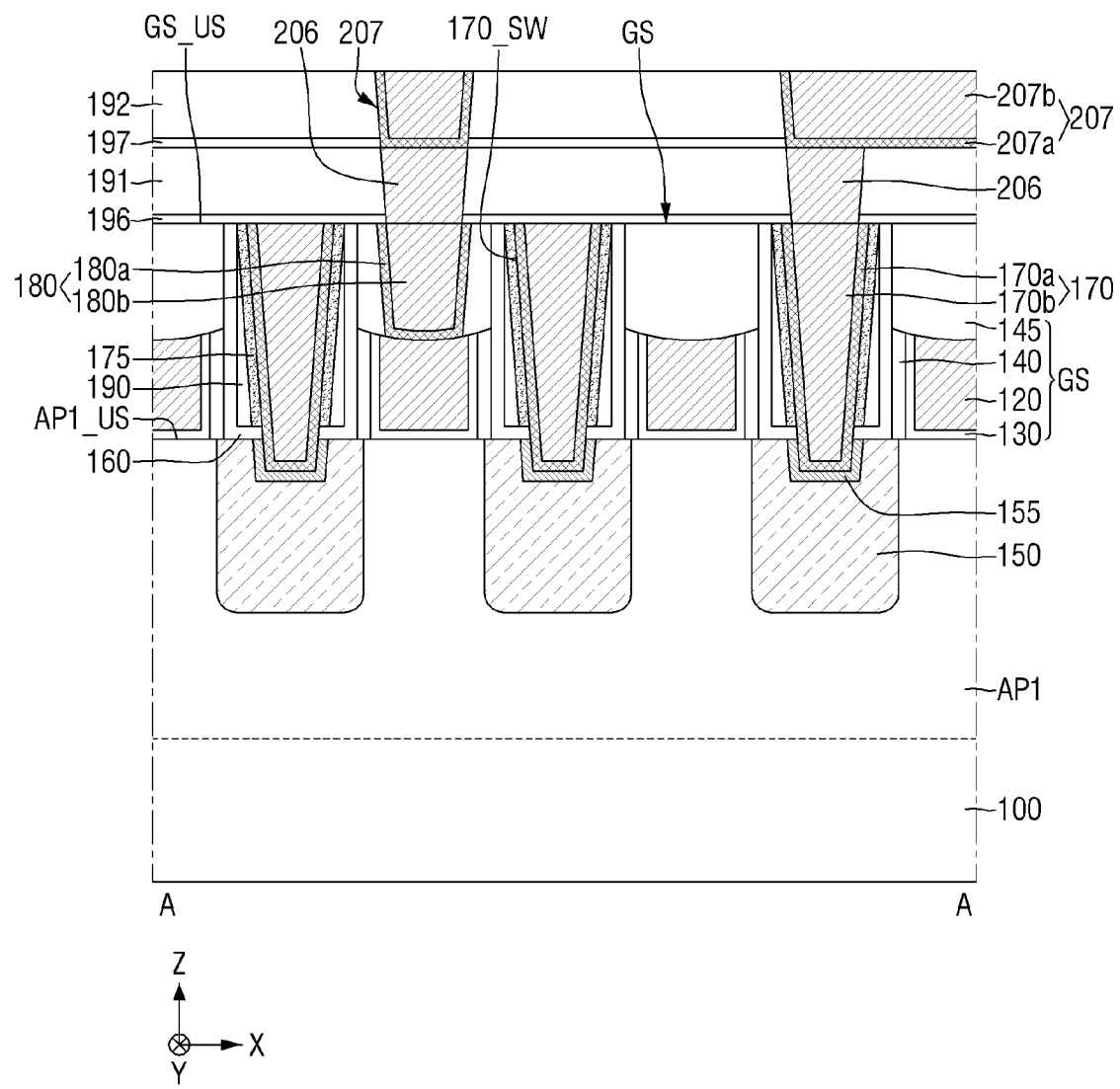
FIG. 18 is a view of a semiconductor device according to some embodiments.
Figure 19:
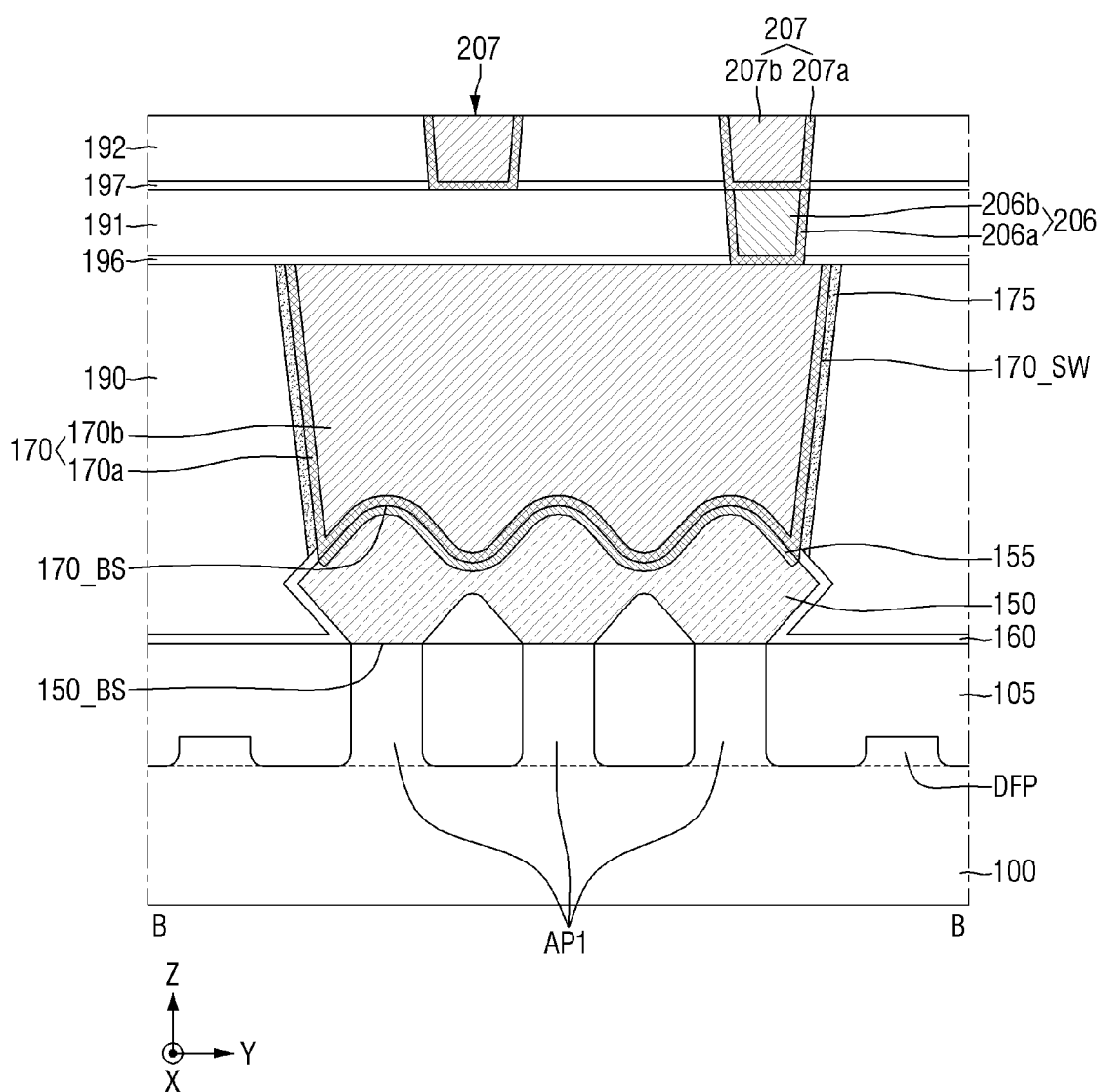
FIG. 19 is a view of a semiconductor device according to some embodiments.
Figure 20:
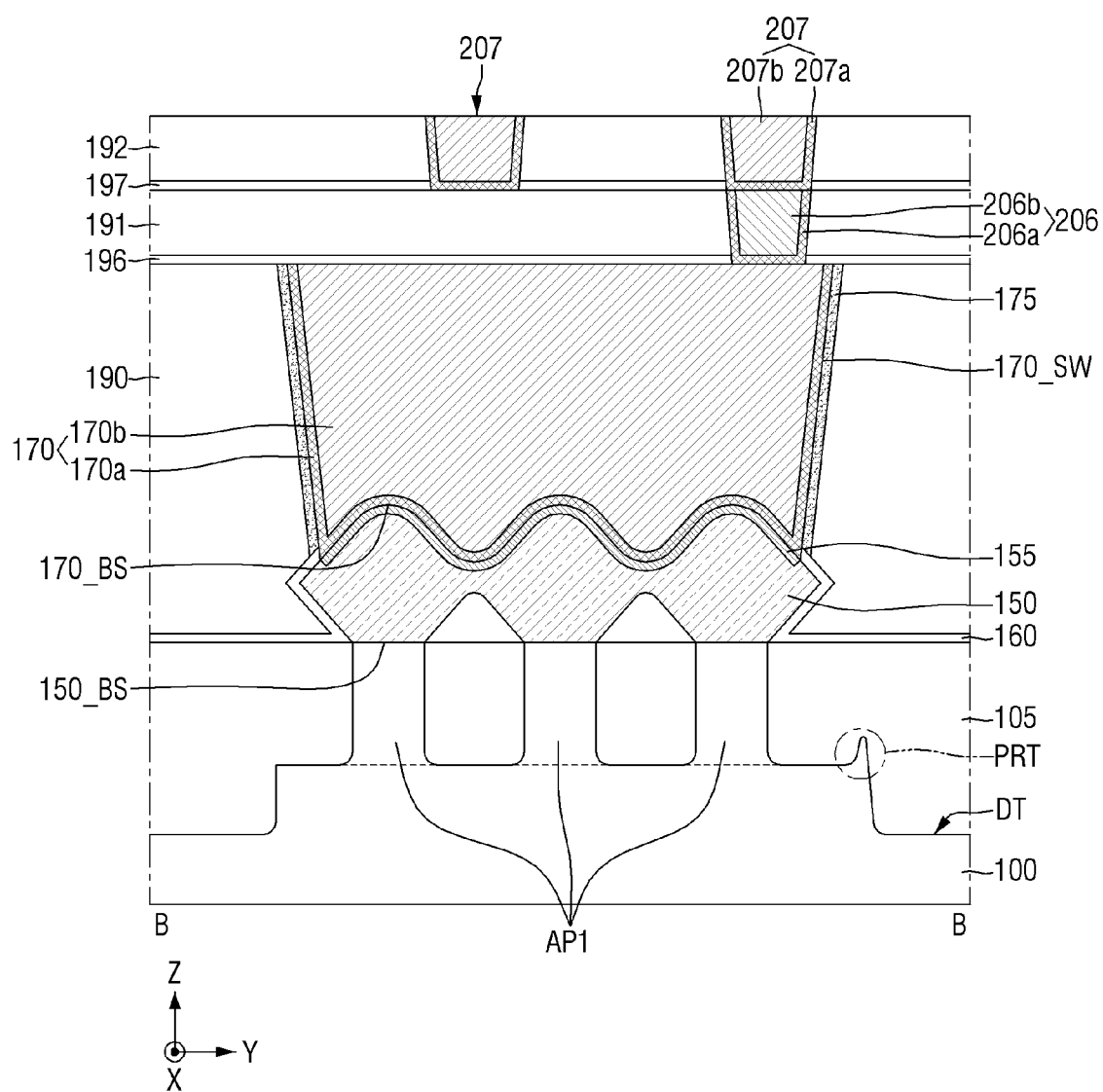
FIG. 20 is a view of a semiconductor device according to some embodiments.

FIG. 18 is a view of a semiconductor device according to some embodiments. FIG. 19 is a view of a semiconductor device according to some embodiments. FIG. 20 is a view of a semiconductor device according to some embodiments. For convenience of explanation, differences from those described with reference to FIGS. 1 to 6 will be mainly described.

Referring to FIG. 18, in the semiconductor device according to some embodiments, the via plug 206 does not include a via barrier layer.

The via plug 206 may have a single conductive layer structure. The via plug 206 may include one of tungsten (W), molybdenum (Mo), ruthenium (Ru), cobalt (Co), and titanium (Ti), but is not limited thereto.

The via plug 206 connected to the first source/drain contact 170 may be a source/drain via plug. The via plug 206 connected to the gate contact 180 may be a gate via plug. Unlike illustrated, one of the source/drain via plug and the gate via plug may have a single conductive layer structure, and the other may have a multiple conductive layer structure as illustrated in FIG. 2.

Referring to FIG. 19, the semiconductor device according to some embodiments may include a dummy protrusion pattern DFP formed in the field region FX.

The deep trench (DT in FIG. 2) is not formed in the field region FX. An upper surface of the dummy protrusion pattern DFP is covered by the field insulating layer 105. The dummy protrusion pattern DFP may include the same material as the first active pattern AP1.

Referring to FIG. 20, the semiconductor device according to some embodiments may further include a protrusion structure PRT disposed along a boundary of the first active region RX1.

The protrusion structure PRT may be disposed at the boundary of the first active region RX1 extending along the first direction X. A first sidewall of the protrusion structure PRT may be defined by a fin trench defining the first active pattern AP1, and a second sidewall of the protrusion structure PRT may be defined by a deep trench DT. The protrusion structure PRT may extend to be long in the first direction X.

The protrusion structure PRT is covered by the field insulating layer 105. The protrusion structure PRT may include the same semiconductor material as the first active pattern AP1.

The protrusion structure PRT is illustrated as being disposed along one of two boundaries of the first active region RX1 extending along the first direction X, but is not limited thereto. Unlike illustrated, the protrusion structure PRT may be disposed along the two boundaries of the first active region RX1 extending along the first direction X.

Although not illustrated, the protrusion structure PRT may be disposed at an edge of the second active region RX2.

Figure 21:
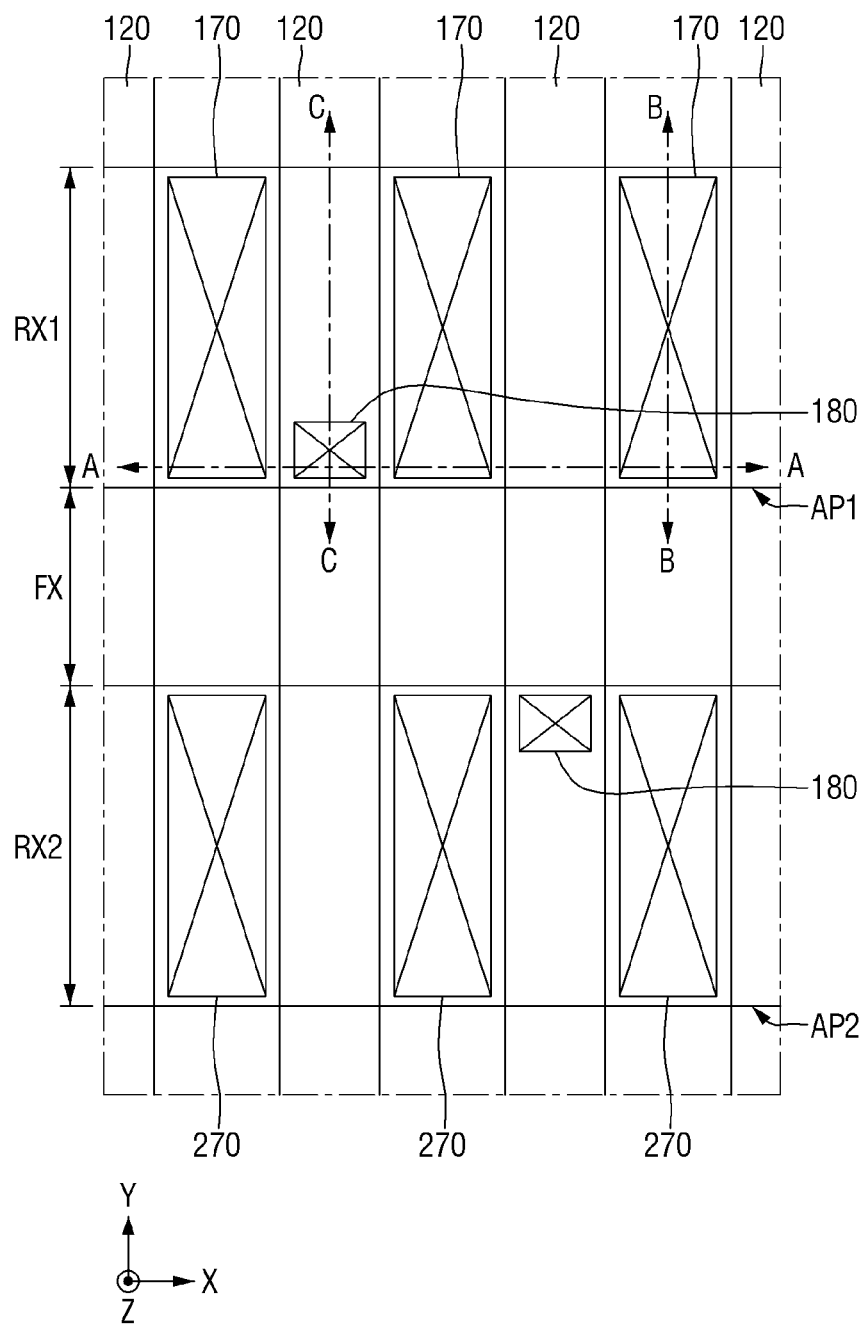
FIGS. 21 to 25 are views of a semiconductor device according to some embodiments.
Figure 22:
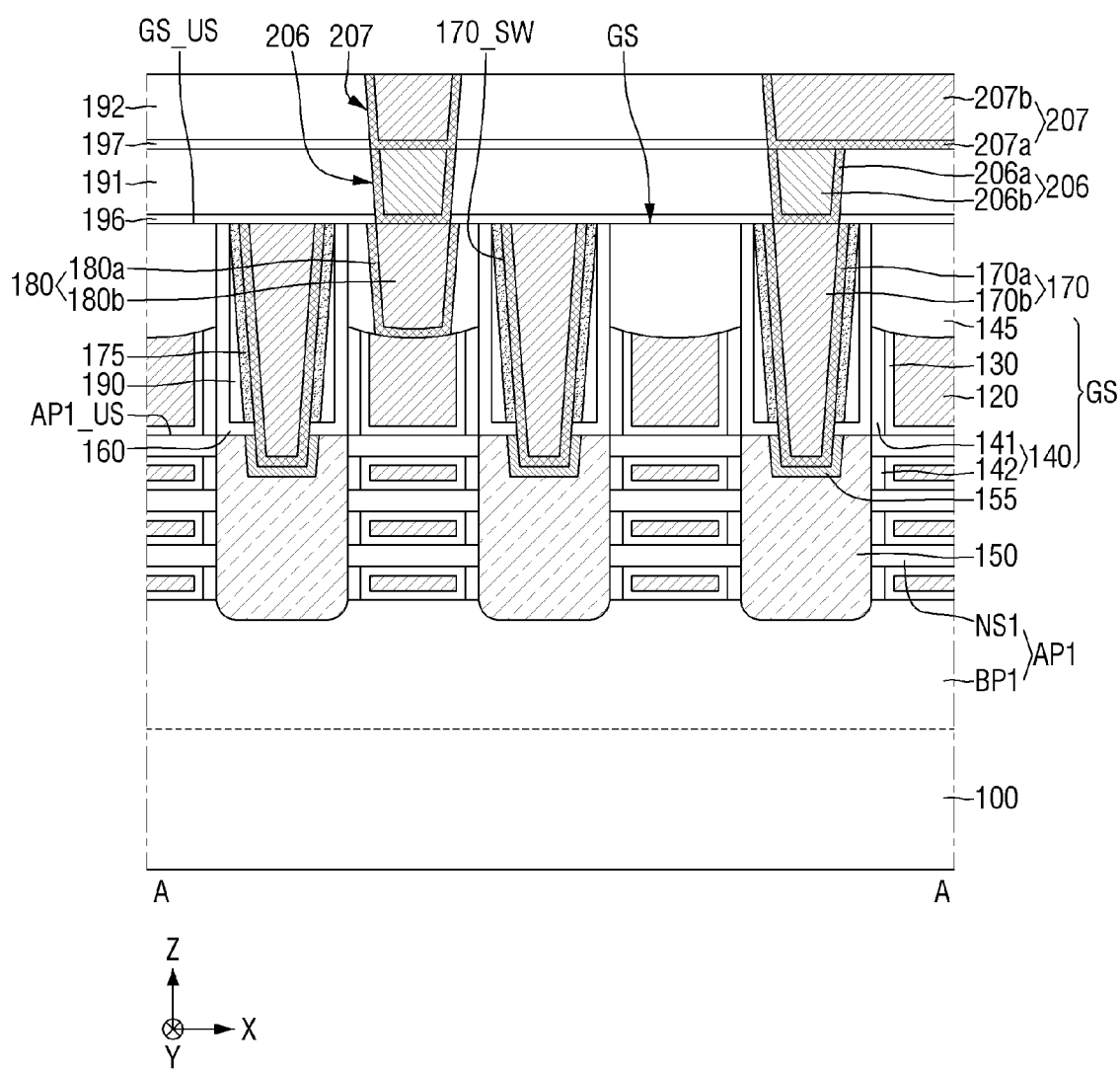
Figure 23:
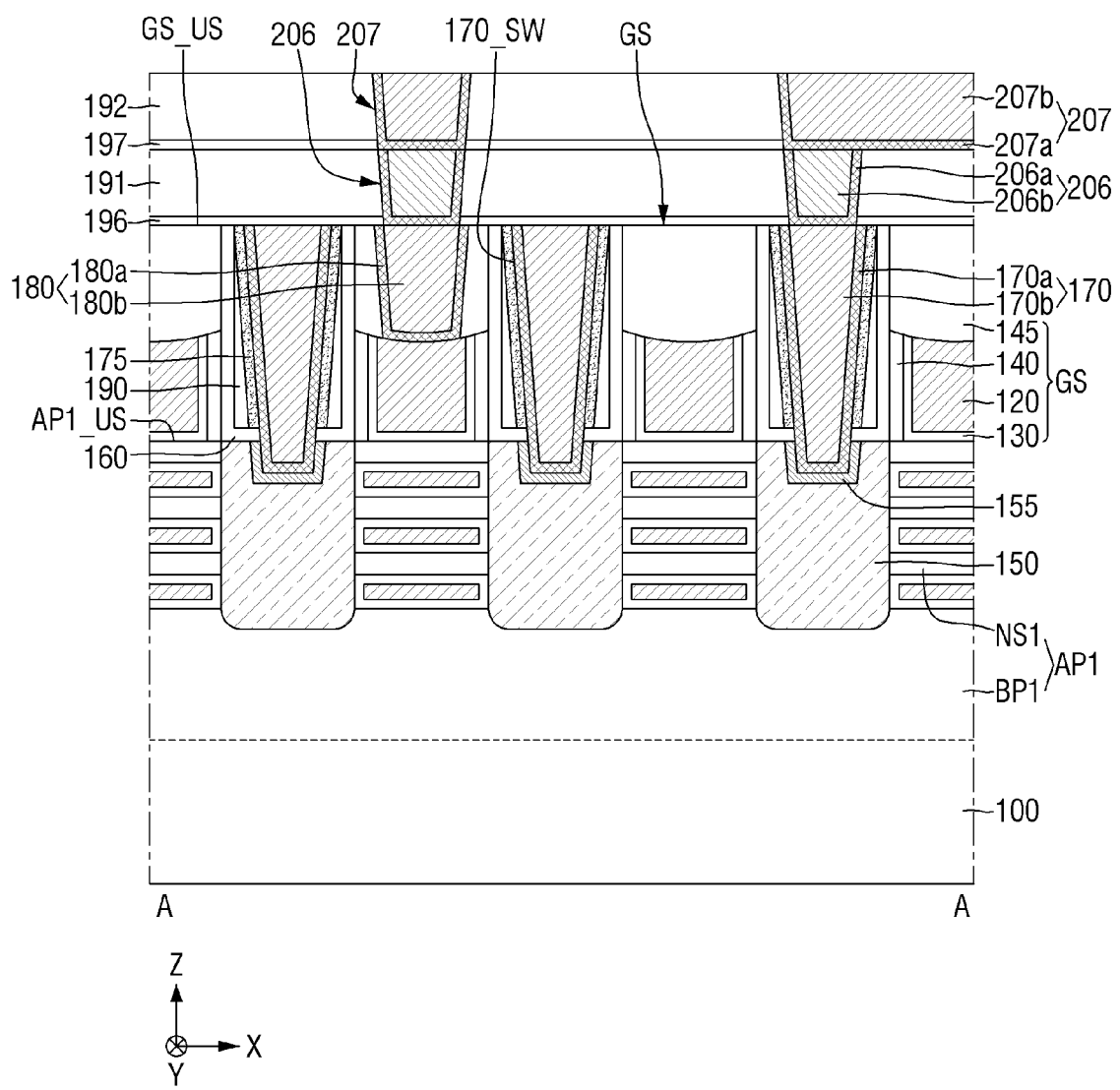
Figure 24:
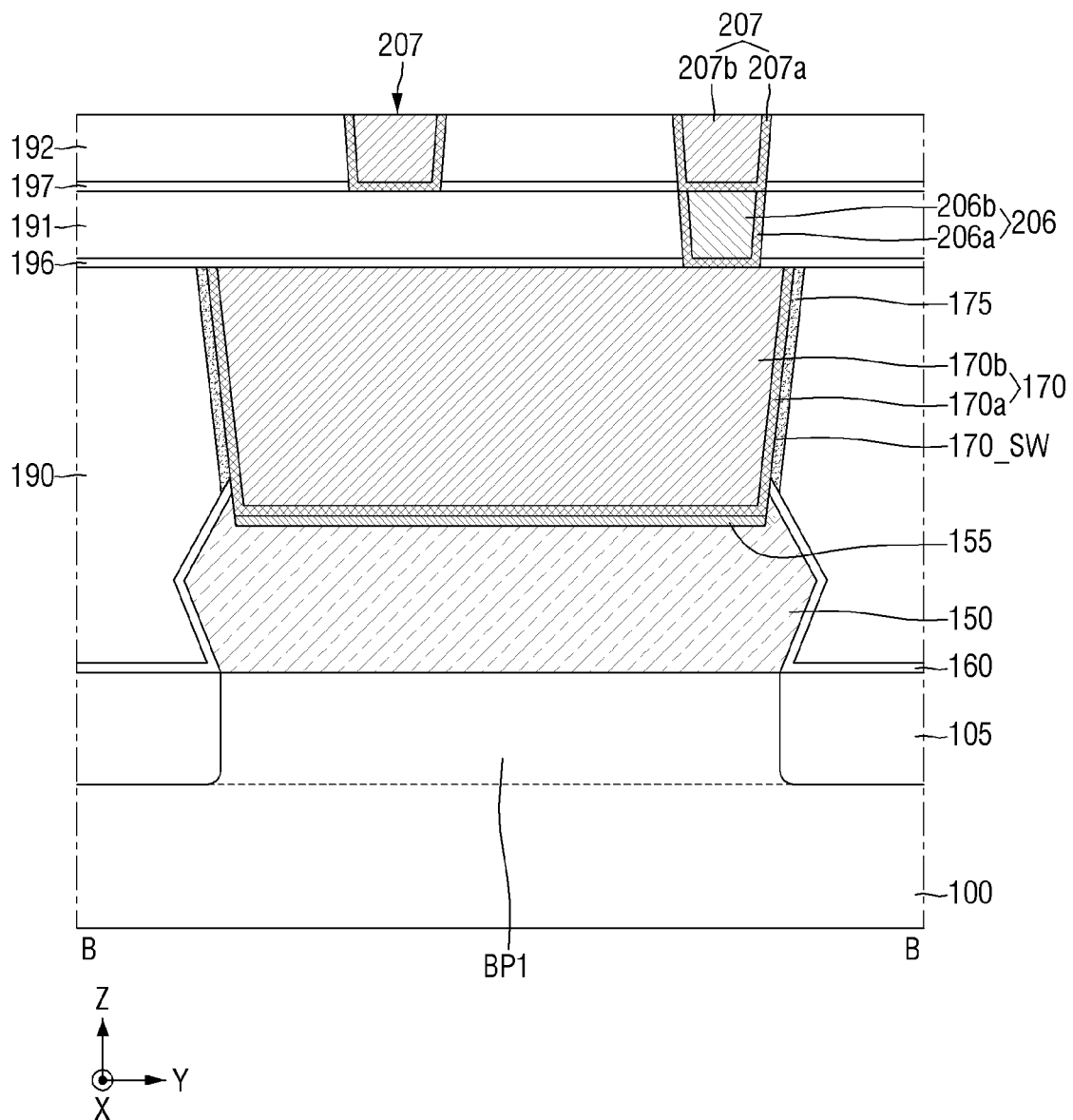
Figure 25:
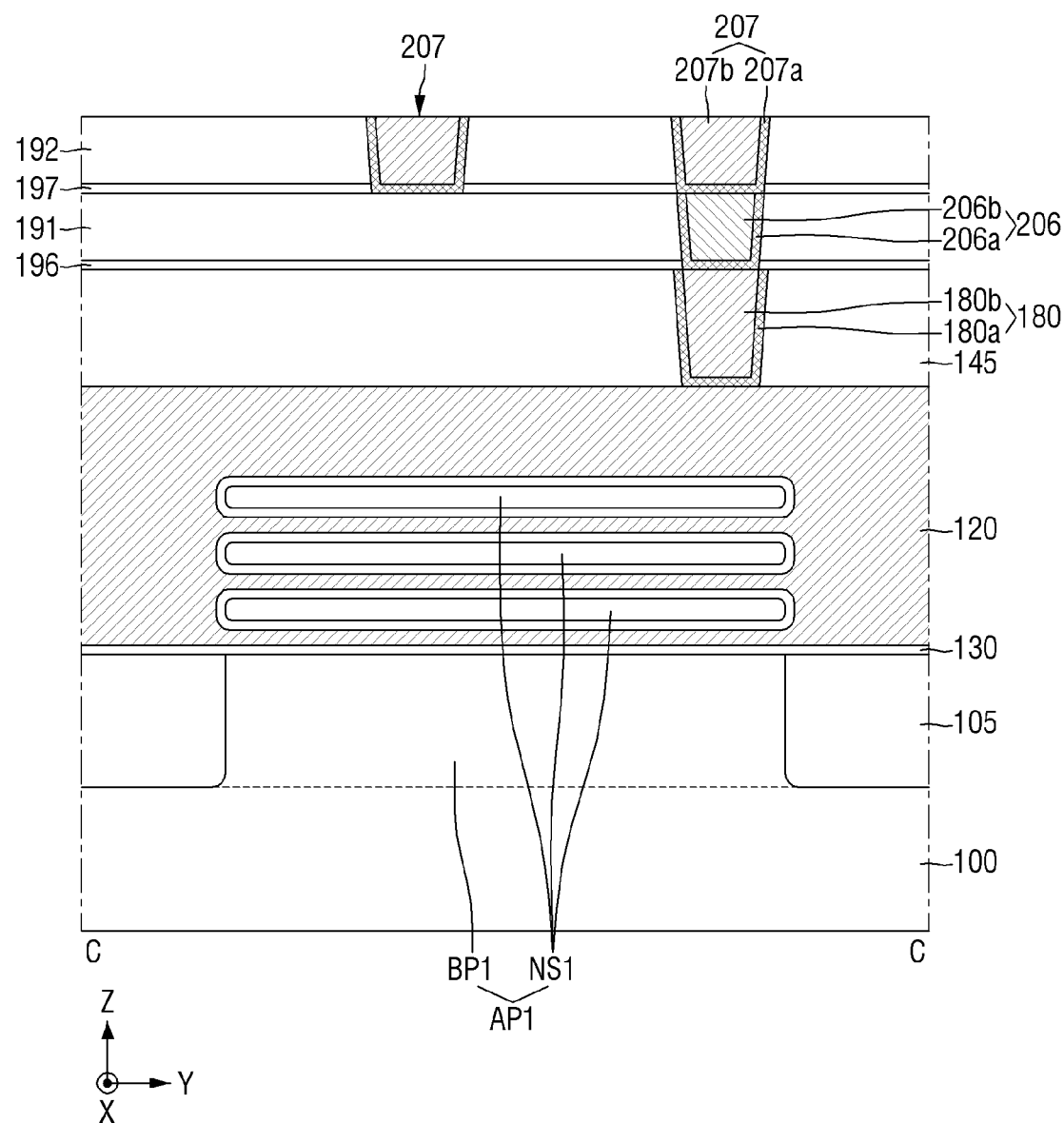

FIGS. 21 to 25 are views of a semiconductor device according to some embodiments. FIG. 21 is an example layout of a semiconductor device according to some embodiments. FIGS. 22 and 23 are example cross-sectional views taken along line A-A of FIG. 21, respectively. FIG. 24 is a cross-sectional view taken along line B-B of FIG. 21. FIG. 25 is a cross-sectional view taken along line C-C of FIG. 21. For convenience of explanation, differences from those described with reference to FIGS. 1 to 6 will be mainly described.

Referring to FIGS. 21 to 25, in a semiconductor device according to some embodiments, the first active pattern AP1 may include a lower pattern BP1 and a sheet pattern NS1.

Although not illustrated, the second active pattern AP2 may include a lower pattern and a sheet pattern.

The lower pattern BP1 may extend along the first direction X. The sheet pattern NS1 may be disposed on the lower pattern BP1 to be spaced apart from the lower pattern BP1.

The sheet pattern NS1 may include a plurality of sheet patterns stacked in the third direction Z. The number of the sheet patterns NS1 is illustrated as being three, but it is only for convenience of explanation and the present disclosure is not limited thereto. An upper surface of the sheet pattern NS1 disposed on the uppermost portion among the sheet patterns NS1 may be the upper surface AP1_US of the first active pattern.

The sheet pattern NS1 may be connected to the first source/drain pattern 150. The sheet pattern NS1 may be a channel pattern used as a channel region of the transistor. For example, the sheet pattern NS1 may be a nanosheet or a nanowire.

The lower pattern BP1 may include, for example, silicon or germanium, which is an elemental semiconductor material. Alternatively, the lower pattern BP1 may include a compound semiconductor, for example, a group IV-IV compound semiconductor or a group III-V compound semiconductor.

The sheet pattern NS1 may include, for example, silicon or germanium, which is an elemental semiconductor material. Alternatively, the sheet pattern NS1 may include a compound semiconductor, for example, a group IV-IV compound semiconductor or a group III-V compound semiconductor.

The gate insulating layer 130 may extend along an upper surface of the lower pattern BP1 and the upper surface of the field insulating layer 105. The gate insulating layer 130 may surround a periphery of the sheet pattern NS1.

The gate electrode 120 is disposed on the lower pattern BP1. The gate electrode 120 intersects the lower pattern BP1. The gate electrode 120 may surround the periphery of the sheet pattern NS1. The gate electrode 120 may be disposed between the lower pattern BP1 and the sheet pattern NS1 and between the sheet patterns NS1 adjacent to each other.

In FIG. 22, the gate spacer 140 may include an outer spacer 141 and an inner spacer 142. The inner spacer 142 may be disposed between the lower pattern BP1 and the sheet pattern NS1 and between the sheet patterns NS1 adjacent to each other.

In FIG. 23, the gate spacer 140 may include only the outer spacer 141. The inner spacer is not disposed between the lower pattern BP1 and the sheet pattern NS1 and between the sheet patterns NS1 adjacent to each other.

A bottom surface of the first source/drain contact 170 may be positioned between an upper surface of the sheet pattern NS1 disposed at the lowermost portion among the plurality of sheet patterns NS1 and a lower surface of the sheet pattern NS1 disposed at the uppermost portion among the plurality of sheet patterns NS1. Unlike illustrated, the bottom surface of the first source/drain contact 170 may be positioned between an upper surface of the sheet pattern NS1 disposed at the uppermost portion and a lower surface of the sheet pattern NS1 disposed at the uppermost portion.

The description of the contact liner 175 is substantially the same as that described with reference to FIGS. 1 to 6, and is thus omitted.

Figure 26:
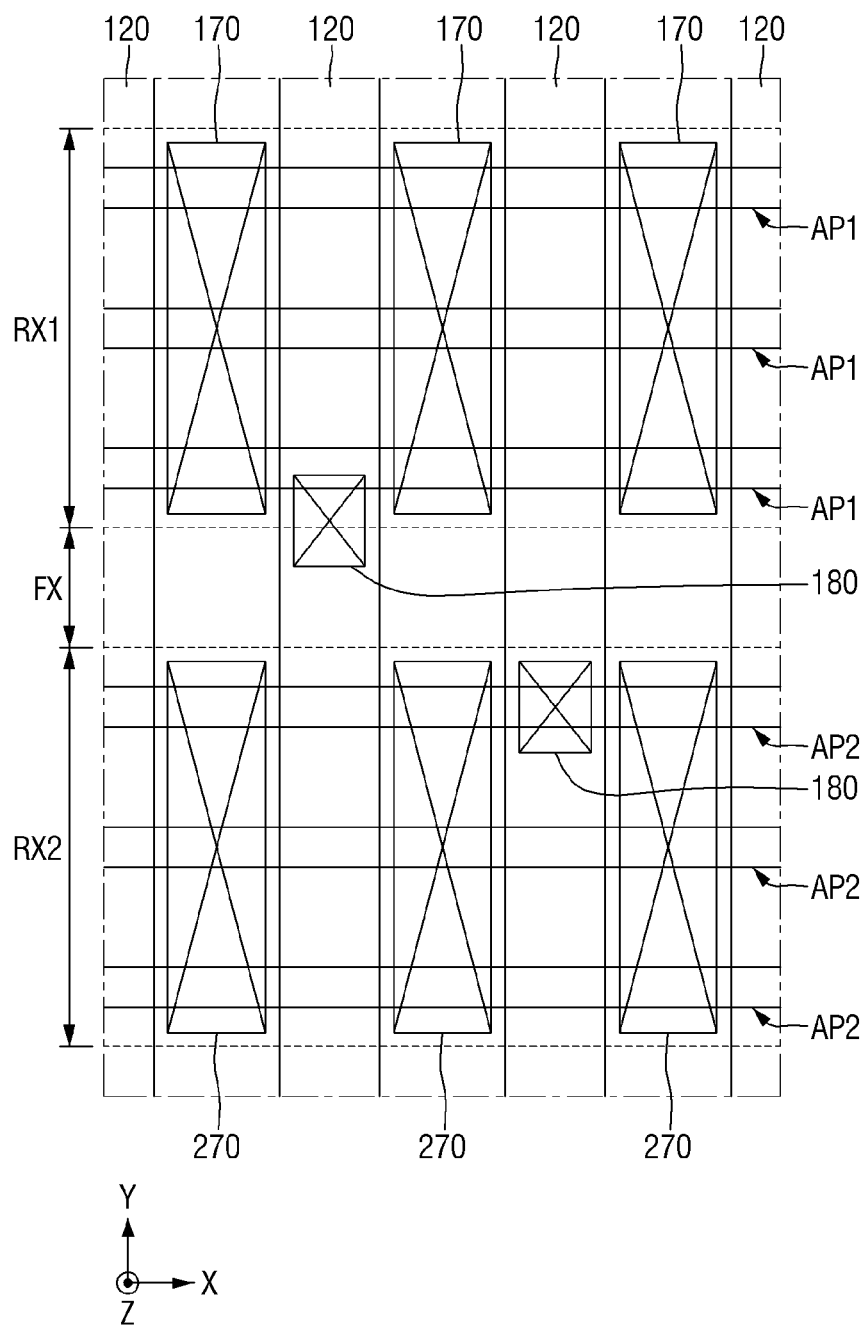
FIGS. 26 and 27 are example layout of semiconductor devices according to some embodiments, respectively.
Figure 27:
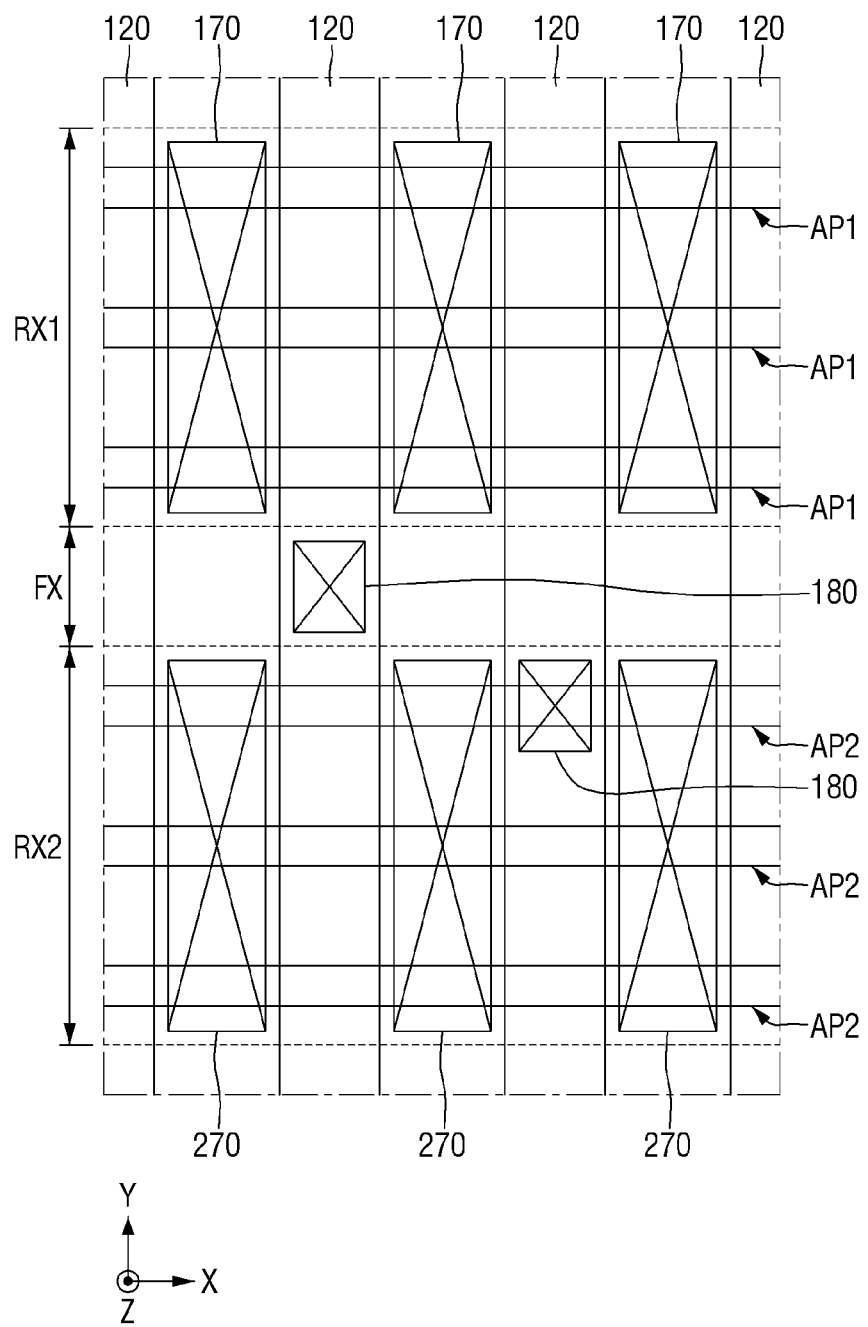

FIGS. 26 and 27 are example layout of semiconductor devices according to some embodiments, respectively. For convenience of explanation, differences from those described with reference to FIGS. 1 to 6 will be mainly described.

Referring to FIG. 26, in the semiconductor device according to some embodiments, in a plan view, at least one of the gate contacts 180 may be disposed across the active regions RX1 and RX2 and the field region FX.

For example, a portion of the gate contact 180 may be disposed at a position overlapping the first active region RX1.

Referring to FIG. 27, in the semiconductor device according to some embodiments, in a plan view, at least one of the gate contacts 180 may be entirely disposed on the field region FX.

At least one of the gate contacts 180 may be disposed at a position that entirely overlaps the field region FX.

In FIGS. 26 and 27, at least other of the gate contacts 180 is illustrated as being entirely disposed on the second active region RX2, but the present disclosure is not limited thereto.

In FIGS. 1, 26, and 27, regardless of the positions of the gate contacts 180, each of the first source/drain contacts 170 and the second source/drain contacts 270 may not include a recessed portion as illustrated in FIG. 3.

Alternatively, depending on the positions of the gate contacts 180, a cross-section (e.g., a view cut in the second direction Y) of each of the first source/drain contacts 170 and a cross-section of each of the second source/drain contacts 270 may have an "L" shape, and may have a "T" shape rotated by 180 degrees (e.g., an inverted T shape).

FIGS. 28 to 33 are views illustrating a method for fabricating a semiconductor device according to some embodiments. For reference, FIGS. 28 to 33 are cross-sectional views taken along line A-A of FIG. 1. The following fabricating method will be described in a viewpoint of a cross-sectional view.

Figure 28:
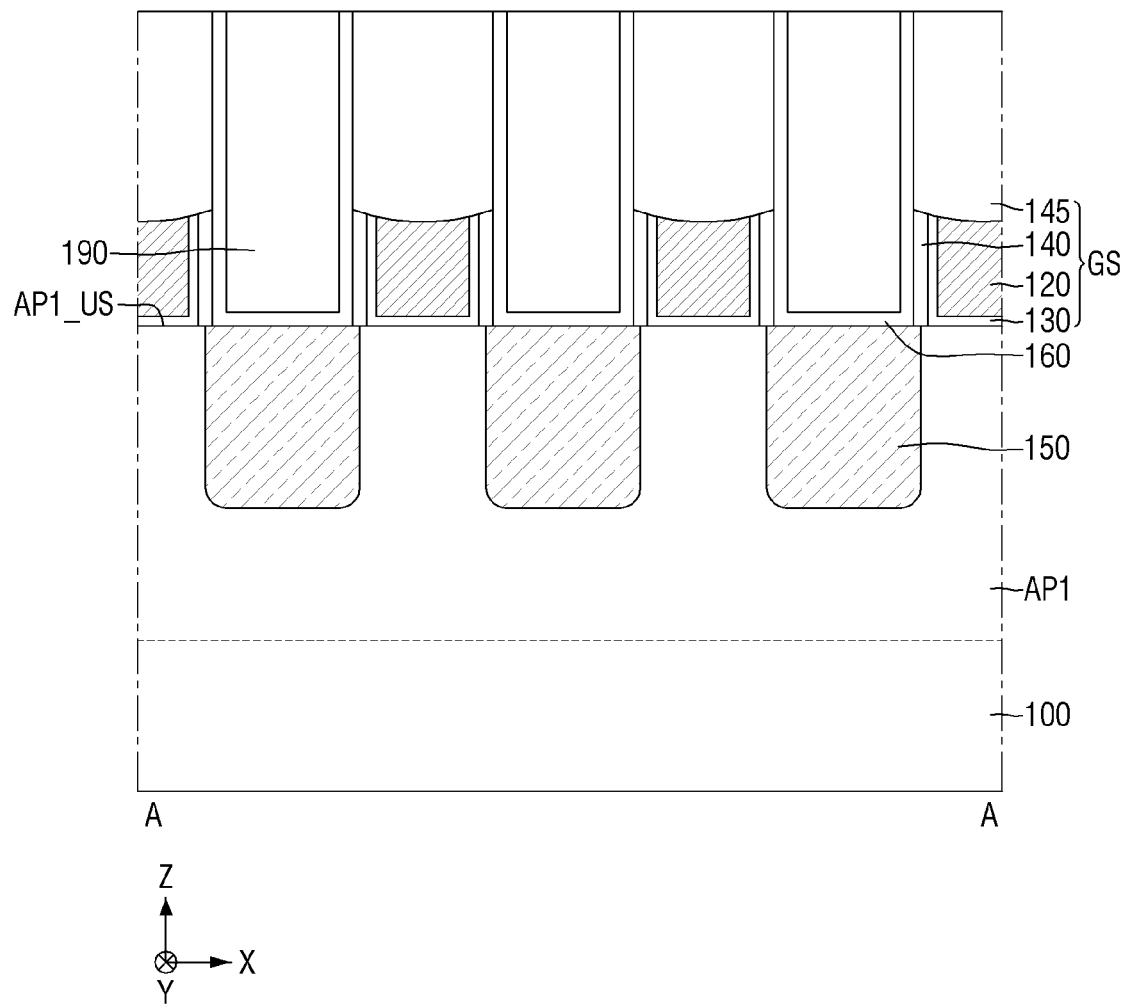
FIGS. 28 to 33 are views illustrating a method for fabricating a semiconductor device according to some embodiments.

Referring to FIG. 28, a source/drain pattern 150 may be formed on a first active pattern AP1.

A source/drain etching stop layer 160 and a first interlayer insulating layer 190 are sequentially formed on the source/drain pattern 150.

After the first interlayer insulating layer 190 is formed, a gate structure GS may be formed through a replacement metal gate (RMG) process.

Figure 29:
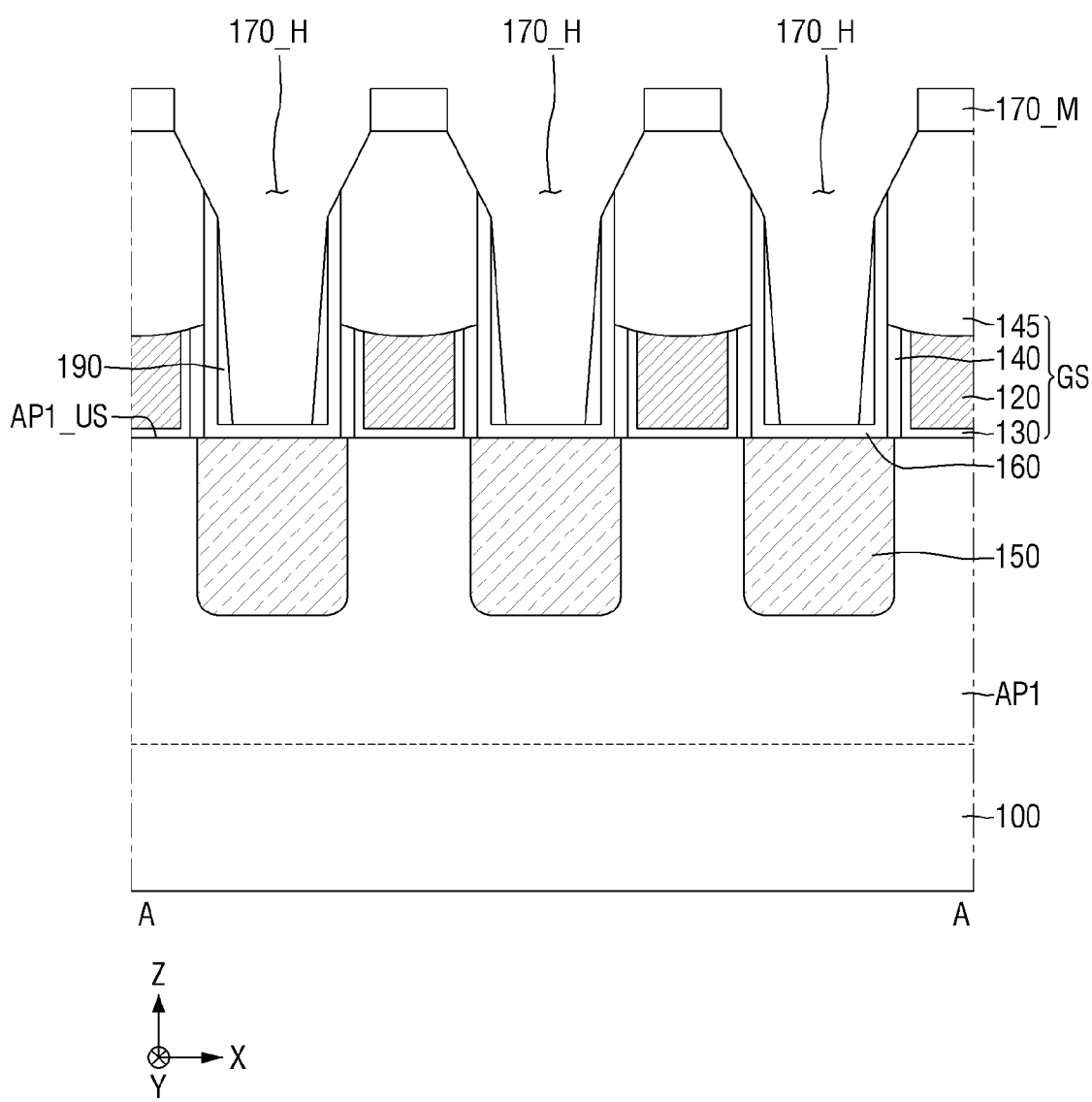

Referring to FIG. 29, a contact hole 170_H may be formed in the first interlayer insulating layer 190.

More specifically, a mask buffer layer may be formed on the gate structure GS. A mask pattern may be formed on the mask buffer layer. The mask buffer layer may include, for example, an oxide, but is not limited thereto.

The contact hole 170_H may be formed in the first interlayer insulating layer 190 by using the mask pattern as a mask. In the process of forming the contact hole 170_H, the mask buffer layer may be patterned. By patterning the mask buffer layer, a mask buffer pattern 170_M may be formed on the gate structure GS.

The contact hole 170_H may expose the source/drain etching stop layer 160. For example, during the formation of the mask buffer pattern 170_M, the contact hole 170_H may not penetrate through the source/drain etching stop layer 160. A bottom surface of the contact hole 170_H may be defined by the source/drain etching stop layer 160.

Unlike illustrated, the contact hole 170_H formed while the mask buffer pattern 170_M is formed may penetrate through the source/drain etching stop layer 160. In this case, the source/drain pattern 150 may be exposed through the contact hole 170_H.

Figure 30:
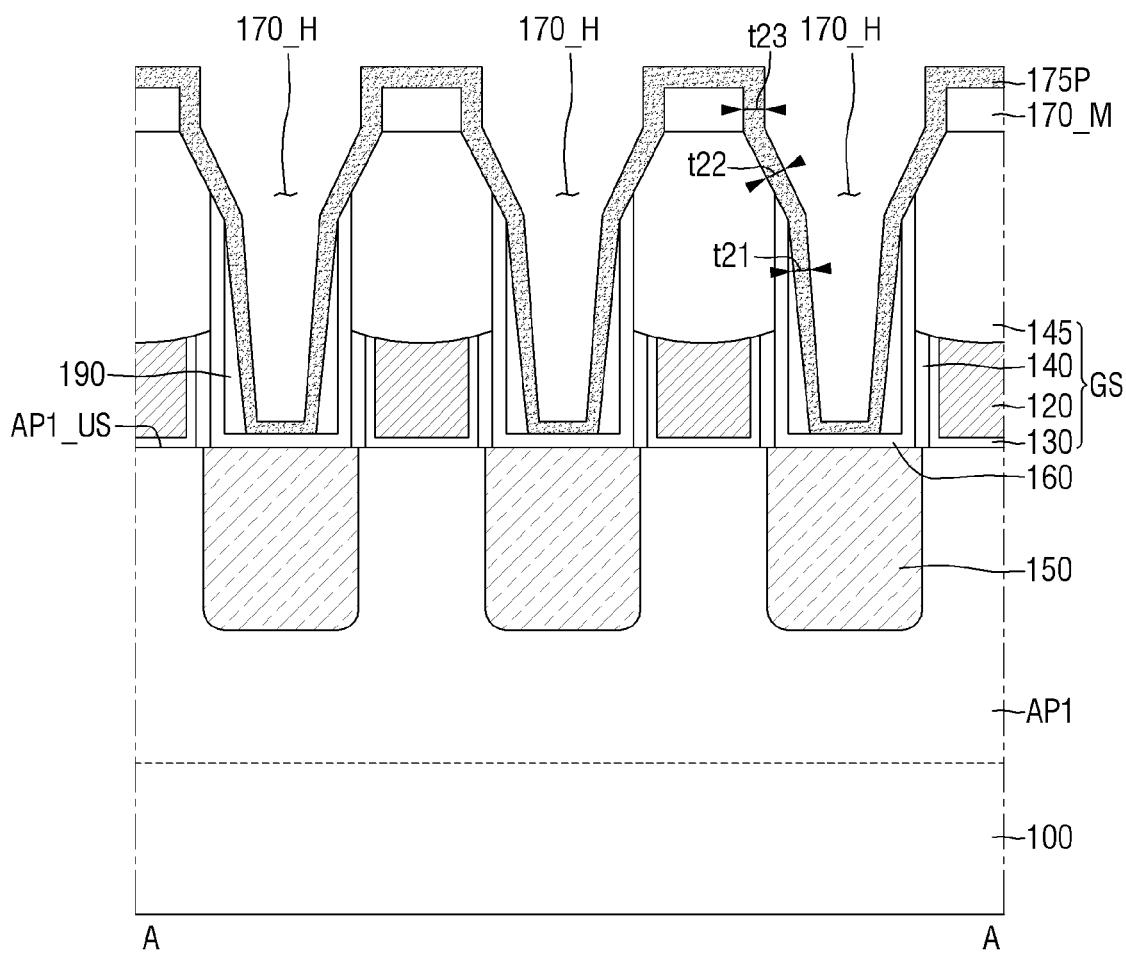

Referring to FIG. 30, a pre-contact liner layer 175P may be formed along a sidewall and a bottom surface of the contact hole 170_H.

The pre-contact liner layer 175P may be formed along an upper surface of the mask buffer pattern 170_M. The pre-contact liner layer 175P may be formed using, for example, chemical vapor deposition (CVD).

A thickness of the pre-contact liner layer 175P extending along the sidewall of the contact hole 170_H may decrease as a distance (e.g., a distance in the third direction Z) from the upper surface of the mask buffer pattern 170_M increases.

For example, based on the upper surface AP1_US of the first active pattern, a thickness t22 of the pre-contact liner layer 175P at a second height is greater than a thickness t21 of the pre-contact liner layer 175P at a first height. Based on the upper surface AP1_US of the first active pattern, the thickness t22 of the pre-contact liner layer 175P at the second height is smaller than a thickness t23 of the pre-contact liner layer 175P at a third height. The second height is greater than the first height and is smaller than the third height. Each of the first, second and third heights refers to a height from the upper surface AP1_US of the first active pattern.

As the distance (e.g., the distance in the third direction Z) from the upper surface AP1_US of the first active pattern increases, a concentration of carbon included in the pre-contact liner layer 175P extending along the sidewall of the contact hole 170_H may increase.

Figure 31:
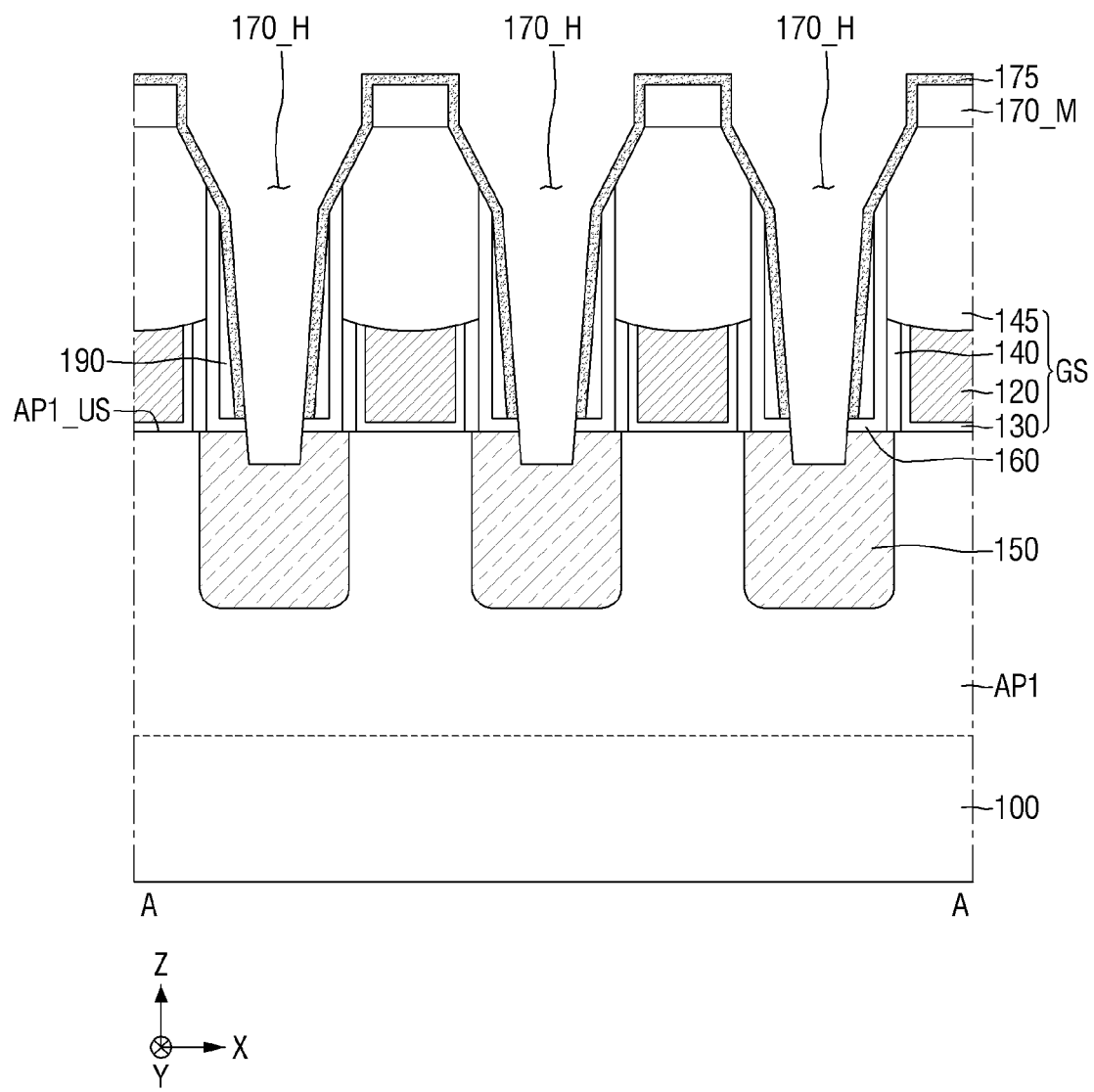

Referring to FIGS. 30 and 31, a contact liner 175 may be formed on the sidewall of the contact hole 170_H by etching a portion of the pre-contact liner layer 175P.

The pre-contact liner layer 175P on the bottom surface of the contact hole 170_H may be removed by using a directional etching. Accordingly, the contact liner 175 may be formed.

After the pre-contact liner layer 175P on the bottom surface of the contact hole 170_H is removed, the source/drain etching stop layer 160 may also be removed. A portion of the source/drain etching stop layer 160 is removed, so that the contact hole 170_H may penetrate through the source/drain etching stop layer 160.

During the formation of the contact liner 175, the contact hole 170_H may expose the source/drain pattern 150. The contact hole 170_H extends to the source/drain pattern 150. In some embodiments, the contact hole 170_H may expose the source/drain pattern 150.

During the formation of the contact liner 175, a portion of the source/drain pattern 150 may be etched. A portion of the sidewall of the contact hole 170_H may be defined by the source/drain pattern 150. Unlike illustrated, the source/drain pattern 150 may not be etched during the formation of the contact liner 175.

During the formation of the contact liner 175, a portion of the pre-contact liner layer 175P extending along the sidewall of the contact hole 170_H may also be removed. Accordingly, as the distance (e.g., the distance in the third direction Z) from the upper surface of the mask buffer pattern 170_M increases, the thickness of the contact liner 175 extending along the sidewall of the contact hole 170_H may be constant.

Unlike illustrated, as the distance from the upper surface of the mask buffer pattern 170_M increases, the thickness of the contact liner 175 extending along the sidewall of the contact hole 170_H may decrease.

Figure 32:
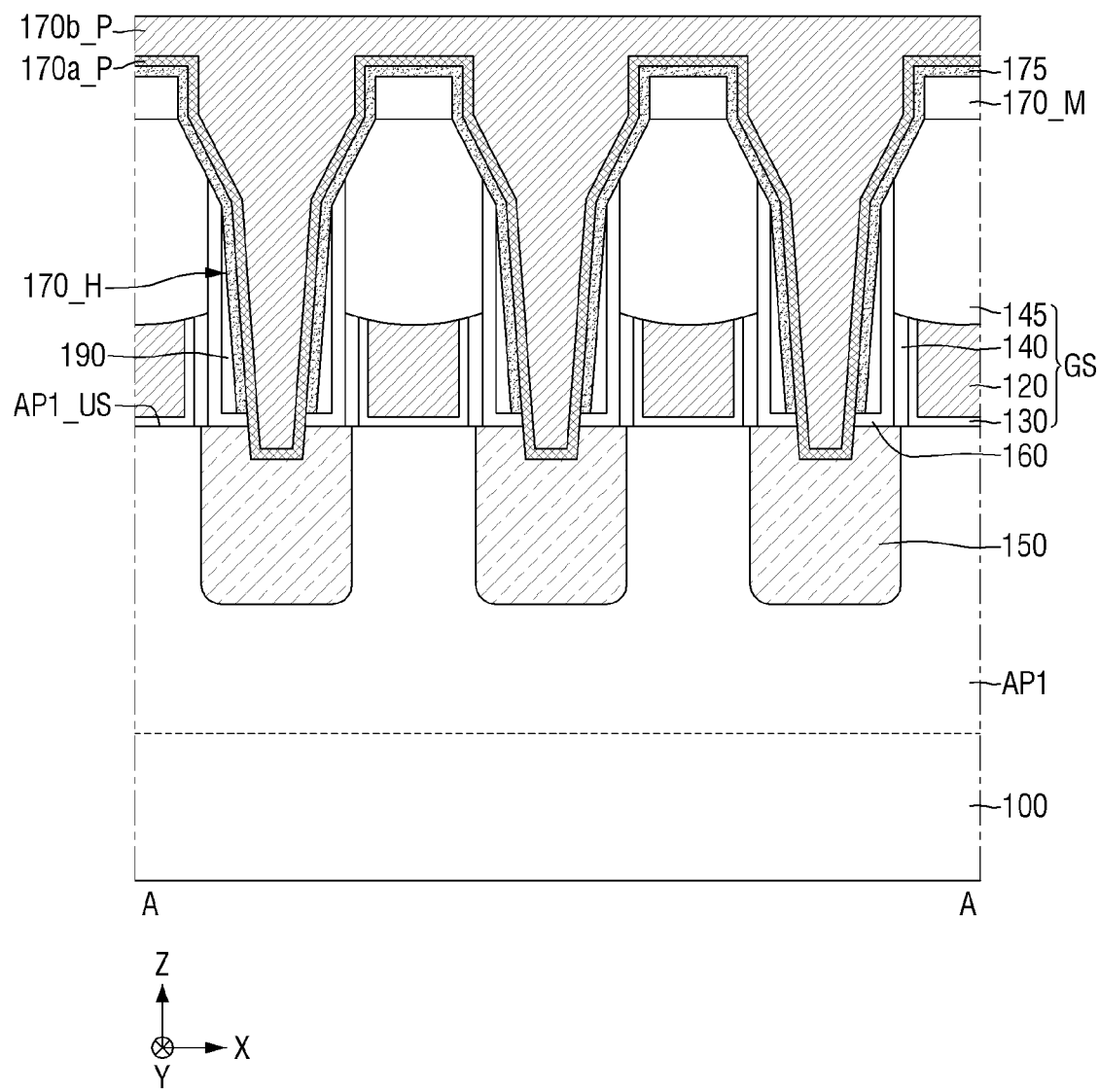

Referring to FIG. 32, a pre-barrier layer 170a_P is formed along the sidewall and the bottom surface of the contact hole 170_H.

The pre-barrier layer 170a_P is formed on the contact liner 175 formed along the sidewall of the contact hole 170_H.

A pre-filling layer 170b_P is formed on the pre-barrier layer 170a_P. The pre-filling layer 170b_P may fill the contact hole 170_H.

For example, before the pre-barrier layer 170a_P is formed, a contact silicide layer 155 may be formed on the source/drain pattern 150. As another example, during the formation of the pre-barrier layer 170a P, the contact silicide layer 155 may be formed on the source/drain pattern 150 through a heat treatment process. As still another example, after the pre-filling layer 170b_P is formed, the contact silicide layer 155 may be formed on the source/drain pattern 150 through a heat treatment process.

Figure 33:
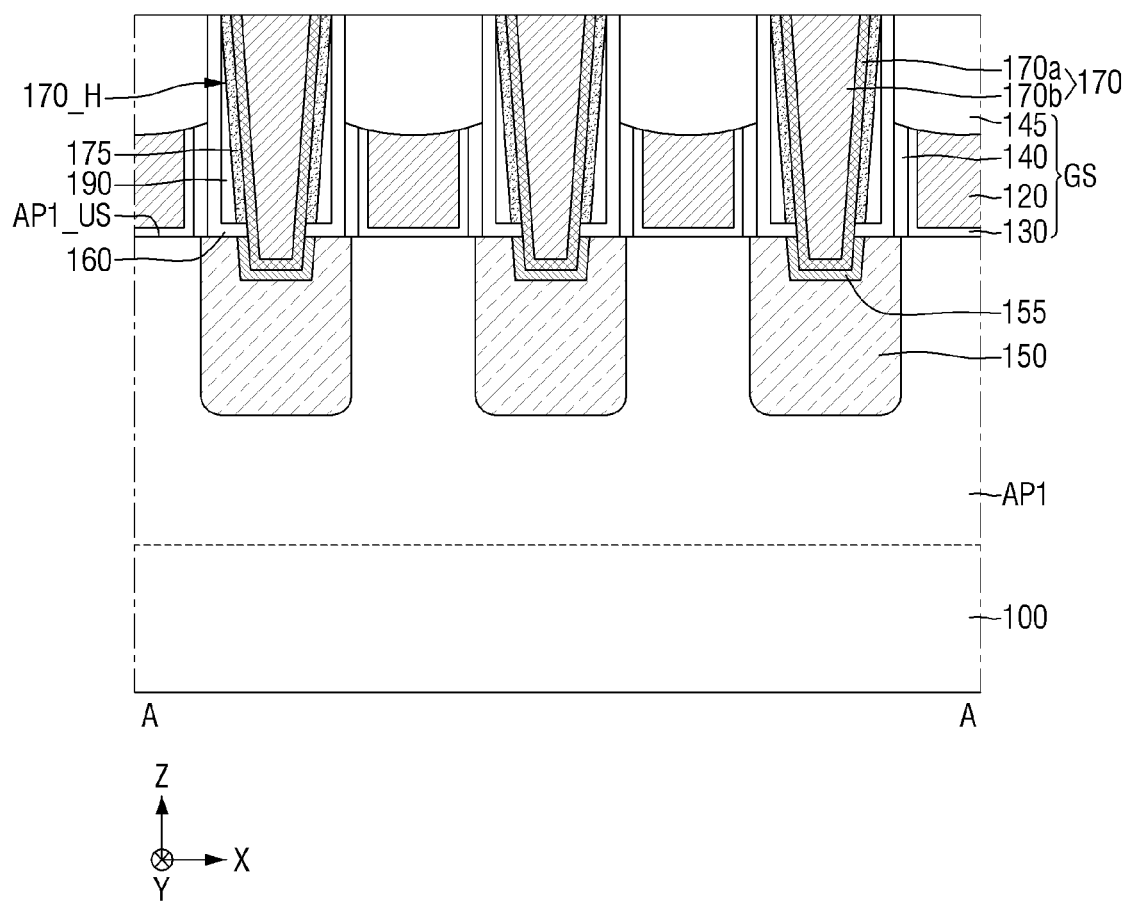

Referring to FIGS. 32 and 33, a first source/drain contact 170 filling the contact hole 170_H may be formed on the contact liner 175.

The first source/drain contact 170 is formed on the source/drain pattern 150. The first source/drain contact 170 is connected to the source/drain pattern 150.

More specifically, the first source/drain contact 170 may be formed by removing a portion of the pre-barrier layer 170a_P and a portion of the pre-filling layer 170b_P. During the formation of the first source/drain contact 170, the mask buffer pattern 170_M may be removed. In addition, during the formation of the first source/drain contact 170, a portion of the gate capping pattern 145 may also be removed.

Next, referring to FIG. 2, a gate contact 180 may be formed on the gate electrode 120. In addition, a via plug 206 and a wiring line 207 may be formed on the first source/drain contact 170 and the gate contact 180.

Unlike illustrated, after the gate contact 180 is formed, the process of forming the first source/drain contact 170 may also be performed.

In concluding the detailed description, those skilled in the art will appreciate that many variations and modifications may be made to the embodiments described herein without substantially departing from the principles of the present inventive concept. Therefore, the embodiments of the invention described herein are used in a generic and descriptive sense only and not for purposes of limitation.

What is claimed is:

1. A semiconductor device comprising:
   an active pattern extending in a first direction;
   a plurality of gate structures spaced apart from each other in the first direction on the active pattern and including a first gate structure that includes a gate electrode and a gate spacer, the gate electrode extending in a second direction;
   a source/drain pattern on the active pattern;
   a source/drain contact on the source/drain pattern; and
   a contact liner extending along a sidewall of the source/drain contact,
   wherein a carbon concentration of the contact liner at a first point of the contact liner is different from a carbon concentration of the contact liner at a second point of the contact liner, and the first point is at a first height from an upper surface of the active pattern, the second point is at a second height from the upper surface of the active pattern, and the first height is smaller than the second height,
   wherein the carbon concentration of the contact liner at the first point of the contact liner is lower than the carbon concentration of the contact liner at the second point of the contact liner.

2. The semiconductor device of claim 1, wherein a thickness of the contact liner at the first height is smaller than a thickness of the contact liner at the second height.

3. The semiconductor device of claim 1, wherein a thickness of the contact liner at the first height is equal to a thickness of the contact liner at the second height.

4. The semiconductor device of claim 1, further comprising an etching stop layer extending along a sidewall of the first gate structure and an upper surface of the source/drain pattern,
wherein the contact liner does not extend through the etching stop layer.

5. The semiconductor device of claim 1, further comprising a contact silicide layer that is between the source/drain contact and the source/drain pattern,
wherein the contact liner is in contact with the contact silicide layer.

6. The semiconductor device of claim 1, wherein the contact liner comprises an insulating material that includes oxygen.

7. The semiconductor device of claim 6, wherein a ratio of carbon to oxygen of the contact liner at the first point is smaller than a ratio of carbon to oxygen of the contact liner at the second point.

8. The semiconductor device of claim 1, wherein the contact liner extends up to an upper surface of the first gate structure.

9. The semiconductor device of claim 1, wherein the contact liner is in contact with the source/drain contact.

10. The semiconductor device of claim 1, wherein the active pattern includes a lower pattern and a plurality of sheet patterns spaced apart from the lower pattern in a third direction that is perpendicular to the first direction and the second direction, and the gate electrode surrounds the plurality of sheet patterns.

11. A semiconductor device comprising: an active pattern extending in a first direction;
a field insulating layer on a sidewall of the active pattern;
a plurality of gate structures spaced apart from each other in the first direction on the active pattern, each of the plurality of gate structures including a gate electrode, and the gate electrode extending in a second direction;
a source/drain pattern on the active pattern;
an etching stop layer extending along an upper surface of the field insulating layer and a surface of the source/drain pattern;
an interlayer insulating layer on the etching stop layer;
a source/drain contact in the interlayer insulating layer and connected to the source/drain pattern; and
a contact liner between the source/drain contact and the interlayer insulating layer, wherein a ratio of carbon to oxygen at a first point of the contact liner is smaller than a ratio of carbon to oxygen at a second point of the contact liner, and
the first point is at a first height from a bottom surface of the source/drain pattern, the second point is at a second height from the bottom surface of the source/drain pattern, and the first height is smaller than the second height.

12. The semiconductor device of claim 11, wherein a thickness of the contact liner at the first height is smaller than a thickness of the contact liner at the second height.

13. The semiconductor device of claim 11, wherein a thickness of the contact liner at the first height is equal to a thickness of the contact liner at the second height.

14. The semiconductor device of claim 11, wherein the contact liner is on the etching stop layer, and
a lowermost portion of the contact liner is in contact with the etching stop layer.

15. The semiconductor device of claim 11, further comprising a contact silicide layer that is between the source/drain contact and the source/drain pattern, wherein the contact liner is in contact with the contact silicide layer.

16. The semiconductor device of claim 11, wherein the contact liner includes SiOC.

17. A semiconductor device comprising:
an active pattern including a lower pattern extending in a first direction and a sheet pattern spaced apart from the lower pattern in a second direction;
a plurality of gate structures spaced apart from each other in the first direction on the lower pattern, each of the plurality of gate structures including a gate electrode and a gate spacer, and the gate electrode extending in a third direction;
a source/drain pattern on the lower pattern and in contact with the sheet pattern; a source/drain contact on the source/drain pattern;
a contact silicide layer between the source/drain pattern and the source/drain contact;
and a contact liner extending along a sidewall of the source/drain contact and including SiOC, wherein a carbon concentration of the contact liner at a first point of the contact liner is lower than a carbon concentration of the contact liner at a second point of the contact liner, and the first point is at a first height from an upper surface of the active pattern, the second point is at a second height from the upper surface of the active pattern, and the first height is smaller than the second height.

18. The semiconductor device of claim 17, wherein a thickness of the contact liner at the first height is smaller than a thickness of the contact liner at the second height.

19. The semiconductor device of claim 17, wherein the contact liner is not in contact with the contact silicide layer.

* * * * *